(12) United States Patent
Choi

(10) Patent No.: US 7,968,998 B1
(45) Date of Patent: Jun. 28, 2011

(54) SIDE LEADED, BOTTOM EXPOSED PAD AND BOTTOM EXPOSED LEAD FUSION QUAD FLAT SEMICONDUCTOR PACKAGE

(75) Inventor: Yeon Ho Choi, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 1328 days.

(21) Appl. No.: 11/425,505

(22) Filed: Jun. 21, 2006

(51) Int. Cl.
*H01L 23/48* (2006.01)

(52) U.S. Cl. ........ 257/693; 257/676; 257/696; 257/666; 257/E23.031

(58) Field of Classification Search .................. 257/693, 257/666, 696, 676 E23.031
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,221,925 A | 9/1980 | Finley et al. | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |

(Continued)

FOREIGN PATENT DOCUMENTS

DE      19734794 A1      8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Junghwa M Im
(74) *Attorney, Agent, or Firm* — Stetina Brunda Garred & Brucker

(57) ABSTRACT

A semiconductor package which includes a generally planar die paddle defining multiple peripheral edge segments and a plurality of leads which are segregated into at least two concentric rows. Connected to the top surface of the die paddle is at least one semiconductor die which is electrically connected to at least some of the leads of each row. At least portions of the die paddle, the leads, and the semiconductor die are encapsulated by a package body, the bottom surfaces of the die paddle and the leads of at least one row thereof being exposed in a common exterior surface of the package body.

20 Claims, 10 Drawing Sheets

U.S. PATENT DOCUMENTS

| | | |
|---|---|---|
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A * | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |

| | | | | | | |
|---|---|---|---|---|---|---|
| 6,034,423 | A | 3/2000 | Mostafazadeh et al. | 6,380,048 | B1 | 4/2002 | Boon et al. |
| 6,040,626 | A | 3/2000 | Cheah et al. | 6,384,472 | B1 | 5/2002 | Huang |
| 6,043,430 | A | 3/2000 | Chun | 6,388,336 | B1 | 5/2002 | Venkateshwaran et al. |
| 6,060,768 | A | 5/2000 | Hayashida et al. | 6,395,578 | B1 | 5/2002 | Shin et al. |
| 6,060,769 | A | 5/2000 | Wark | 6,400,004 | B1 | 6/2002 | Fan et al. |
| 6,072,228 | A | 6/2000 | Hinkle et al. | 6,410,979 | B2 | 6/2002 | Abe |
| 6,075,284 | A | 6/2000 | Choi et al. | 6,414,385 | B1 | 7/2002 | Huang et al. |
| 6,081,029 | A | 6/2000 | Yamaguchi | 6,420,779 | B1 | 7/2002 | Sharma et al. |
| 6,084,310 | A | 7/2000 | Mizuno et al. | 6,429,508 | B1 | 8/2002 | Gang |
| 6,087,715 | A | 7/2000 | Sawada et al. | 6,437,429 | B1 | 8/2002 | Su et al. |
| 6,087,722 | A | 7/2000 | Lee et al. | 6,444,499 | B1 | 9/2002 | Swiss et al. |
| 6,100,594 | A | 8/2000 | Fukui et al. | 6,448,633 | B1 | 9/2002 | Yee et al. |
| 6,113,473 | A | 9/2000 | Costantini et al. | 6,452,279 | B2 | 9/2002 | Shimoda |
| 6,114,752 | A | 9/2000 | Huang et al. | 6,459,148 | B1 | 10/2002 | Chun-Jen et al. |
| 6,118,174 | A | 9/2000 | Kim | 6,464,121 | B2 | 10/2002 | Reijnders |
| 6,118,184 | A | 9/2000 | Ishio et al. | 6,476,469 | B2 | 11/2002 | Huang et al. |
| RE36,907 | E | 10/2000 | Templeton, Jr. et al. | 6,476,474 | B1 | 11/2002 | Hung |
| 6,130,115 | A | 10/2000 | Okumura et al. | 6,482,680 | B1 | 11/2002 | Khor et al. |
| 6,130,473 | A | 10/2000 | Mostafazadeh et al. | 6,498,099 | B1 | 12/2002 | McLellan et al. |
| 6,133,623 | A | 10/2000 | Otsuki et al. | 6,498,392 | B2 | 12/2002 | Azuma |
| 6,140,154 | A | 10/2000 | Hinkle et al. | 6,507,096 | B2 | 1/2003 | Gang |
| 6,143,981 | A | 11/2000 | Glenn | 6,507,120 | B2 | 1/2003 | Lo et al. |
| 6,150,709 | A * | 11/2000 | Shin et al. | 6,534,849 | B1 | 3/2003 | Gang |
| 6,157,074 | A | 12/2000 | Lee | 6,545,332 | B2 | 4/2003 | Huang |
| 6,169,329 | B1 | 1/2001 | Farnworth et al. | 6,545,345 | B1 | 4/2003 | Glenn et al. |
| 6,177,718 | B1 | 1/2001 | Kozono | 6,559,525 | B2 | 5/2003 | Huang |
| 6,181,002 | B1 | 1/2001 | Juso et al. | 6,566,168 | B2 | 5/2003 | Gang |
| 6,184,465 | B1 | 2/2001 | Corisis | 6,583,503 | B2 | 6/2003 | Akram et al. |
| 6,184,573 | B1 | 2/2001 | Pu | 6,603,196 | B2 | 8/2003 | Lee et al. |
| 6,194,777 | B1 | 2/2001 | Abbott et al. | 6,624,005 | B1 | 9/2003 | Di Caprio et al. |
| 6,197,615 | B1 | 3/2001 | Song et al. | 6,627,977 | B1 | 9/2003 | Foster |
| 6,198,171 | B1 | 3/2001 | Huang et al. | 6,667,546 | B2 | 12/2003 | Huang et al. |
| 6,201,186 | B1 | 3/2001 | Daniels et al. | 6,818,973 | B1 * | 11/2004 | Foster ........................ 257/676 |
| 6,201,292 | B1 | 3/2001 | Yagi et al. | 6,876,068 | B1 * | 4/2005 | Lee et al. .................... 257/676 |
| 6,204,554 | B1 | 3/2001 | Ewer et al. | 6,967,125 | B2 | 11/2005 | Fee et al. |
| 6,208,020 | B1 | 3/2001 | Minamio et al. | 6,995,459 | B2 * | 2/2006 | Lee et al. .................... 257/676 |
| 6,208,021 | B1 | 3/2001 | Ohuchi et al. | 7,005,327 | B2 | 2/2006 | Kung et al. |
| 6,208,023 | B1 | 3/2001 | Nakayama et al. | 7,045,396 | B2 | 5/2006 | Crowley et al. |
| 6,211,462 | B1 | 4/2001 | Carter, Jr. et al. | 7,075,816 | B2 | 7/2006 | Fee et al. |
| 6,218,731 | B1 | 4/2001 | Huang et al. | 7,109,572 | B2 | 9/2006 | Fee et al. |
| 6,222,258 | B1 | 4/2001 | Asano et al. | 7,193,298 | B2 | 3/2007 | Hong et al. |
| 6,222,259 | B1 | 4/2001 | Park et al. | 7,211,471 | B1 | 5/2007 | Foster |
| 6,225,146 | B1 | 5/2001 | Yamaguchi et al. | 7,245,007 | B1 | 7/2007 | Foster |
| 6,229,200 | B1 | 5/2001 | Mclellan et al. | 2001/0008305 | A1 | 7/2001 | McLellan et al. |
| 6,229,205 | B1 | 5/2001 | Jeong et al. | 2001/0014538 | A1 | 8/2001 | Kwan et al. |
| 6,239,367 | B1 | 5/2001 | Hsuan et al. | 2002/0011654 | A1 | 1/2002 | Kimura |
| 6,239,384 | B1 | 5/2001 | Smith et al. | 2002/0024122 | A1 | 2/2002 | Jung et al. |
| 6,242,281 | B1 | 6/2001 | Mclellan et al. | 2002/0027297 | A1 | 3/2002 | Ikenaga et al. |
| 6,256,200 | B1 | 7/2001 | Lam et al. | 2002/0140061 | A1 | 10/2002 | Lee |
| 6,258,629 | B1 | 7/2001 | Niones et al. | 2002/0140068 | A1 | 10/2002 | Lee et al. |
| 6,281,566 | B1 | 8/2001 | Magni | 2002/0153599 | A1 * | 10/2002 | Chang et al. ................ 257/676 |
| 6,281,568 | B1 | 8/2001 | Glenn et al. | 2002/0163015 | A1 | 11/2002 | Lee et al. |
| 6,282,095 | B1 | 8/2001 | Houghton et al. | 2003/0030131 | A1 | 2/2003 | Lee et al. |
| 6,285,075 | B1 | 9/2001 | Combs et al. | 2003/0073265 | A1 | 4/2003 | Hu et al. |
| 6,291,271 | B1 | 9/2001 | Lee et al. | 2004/0056277 | A1 | 3/2004 | Karnezos |
| 6,291,273 | B1 | 9/2001 | Miyaki et al. | 2004/0061204 | A1 * | 4/2004 | Han et al. .................... 257/666 |
| 6,294,100 | B1 | 9/2001 | Fan et al. | 2004/0061212 | A1 | 4/2004 | Karnezos |
| 6,294,830 | B1 | 9/2001 | Fjelstad | 2004/0061213 | A1 | 4/2004 | Karnezos |
| 6,295,977 | B1 | 10/2001 | Ripper et al. | 2004/0063242 | A1 | 4/2004 | Karnezos |
| 6,297,548 | B1 | 10/2001 | Moden et al. | 2004/0063246 | A1 | 4/2004 | Karnezos |
| 6,303,984 | B1 | 10/2001 | Corisis | 2004/0065963 | A1 | 4/2004 | Karnezos |
| 6,303,997 | B1 | 10/2001 | Lee | 2004/0097016 | A1 | 5/2004 | Yee et al. |
| 6,307,272 | B1 | 10/2001 | Takahashi et al. | 2004/0164387 | A1 | 8/2004 | Ikenaga et al. |
| 6,309,909 | B1 | 10/2001 | Ohgiyama | 2005/0056914 | A1 * | 3/2005 | Hong et al. .................. 257/666 |
| 6,316,822 | B1 | 11/2001 | Venkateshwaran et al. | 2005/0199987 | A1 | 9/2005 | Danno et al. |
| 6,316,838 | B1 | 11/2001 | Ozawa et al. | 2007/0023202 | A1 | 2/2007 | Shibata |
| 6,323,550 | B1 | 11/2001 | Martin et al. | | | | |
| 6,326,243 | B1 | 12/2001 | Suzuya et al. | | | | |
| 6,326,244 | B1 | 12/2001 | Brooks et al. | | | | |
| 6,326,678 | B1 | 12/2001 | Karmezos et al. | | | | |
| 6,335,564 | B1 | 1/2002 | Pour | | | | |
| 6,337,510 | B1 | 1/2002 | Chun-Jen et al. | | | | |
| 6,339,252 | B1 | 1/2002 | Niones et al. | | | | |
| 6,339,255 | B1 | 1/2002 | Shin | | | | |
| 6,348,726 | B1 | 2/2002 | Bayan et al. | | | | |
| 6,355,502 | B1 | 3/2002 | Kang et al. | | | | |
| 6,369,447 | B2 | 4/2002 | Mori | | | | |
| 6,369,454 | B1 | 4/2002 | Chung | | | | |
| 6,373,127 | B1 | 4/2002 | Baudouin et al. | | | | |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |

| | | |   | | | |
|---|---|---|---|---|---|---|
| JP | 58160096 | 8/1983 | | JP | 8222682 | 8/1996 |
| JP | 59208756 | 11/1984 | | JP | 8306853 | 11/1996 |
| JP | 59227143 | 12/1984 | | JP | 98205 | 1/1997 |
| JP | 60010756 | 1/1985 | | JP | 98206 | 1/1997 |
| JP | 60116239 | 8/1985 | | JP | 98207 | 1/1997 |
| JP | 60195957 | 10/1985 | | JP | 992775 | 4/1997 |
| JP | 60231349 | 11/1985 | | JP | 9260568 | 10/1997 |
| JP | 6139555 | 2/1986 | | JP | 9293822 | 11/1997 |
| JP | 61248541 | 11/1986 | | JP | 10022447 | 1/1998 |
| JP | 629639 | 1/1987 | | JP | 10163401 | 6/1998 |
| JP | 6333854 | 2/1988 | | JP | 10199934 | 7/1998 |
| JP | 63067762 | 3/1988 | | JP | 10256240 | 9/1998 |
| JP | 63188964 | 8/1988 | | JP | 11307675 | 11/1999 |
| JP | 63205935 | 8/1988 | | JP | 00150765 | 5/2000 |
| JP | 63233555 | 9/1988 | | JP | 556398 | 10/2000 |
| JP | 63249345 | 10/1988 | | JP | 20000086238 | 12/2000 |
| JP | 63289951 | 11/1988 | | JP | 2001060648 | 3/2001 |
| JP | 63316470 | 12/1988 | | JP | 200204397 | 8/2002 |
| JP | 64054749 | 3/1989 | | KR | 941979 | 1/1994 |
| JP | 1106456 | 4/1989 | | KR | 19940010938 | 5/1994 |
| JP | 1175250 | 7/1989 | | KR | 19950041844 | 11/1995 |
| JP | 1205544 | 8/1989 | | KR | 19950044554 | 11/1995 |
| JP | 1251747 | 10/1989 | | KR | 19950052621 | 12/1995 |
| JP | 2129948 | 5/1990 | | KR | 1996074111 | 12/1996 |
| JP | 369248 | 7/1991 | | KR | 9772358 | 11/1997 |
| JP | 3177060 | 8/1991 | | KR | 100220154 | 6/1999 |
| JP | 3289162 | * 12/1991 | | KR | 20000072714 | 12/2000 |
| JP | 4098864 | 9/1992 | | KR | 0049944 | 6/2002 |
| JP | 5129473 | 5/1993 | | WO | 9956316 | 11/1999 |
| JP | 5166992 | 7/1993 | | WO | 9967821 | 12/1999 |
| JP | 5283460 | 10/1993 | | | | |
| JP | 6061401 | 3/1994 | | | | |
| JP | 692076 | 4/1994 | | | | |
| JP | 6140563 | 5/1994 | | | | |
| JP | 6252333 | * 9/1994 | | | | |
| JP | 6260532 | 9/1994 | | | | |
| JP | 19950018924 | 6/1995 | | | | |
| JP | 7297344 | 11/1995 | | | | |
| JP | 7312405 | 11/1995 | | | | |
| JP | 864634 | 3/1996 | | | | |
| JP | 8083877 | 3/1996 | | | | |
| JP | 8125066 | 5/1996 | | | | |
| JP | 96-4284 | 6/1996 | | | | |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322til.shtml.

* cited by examiner

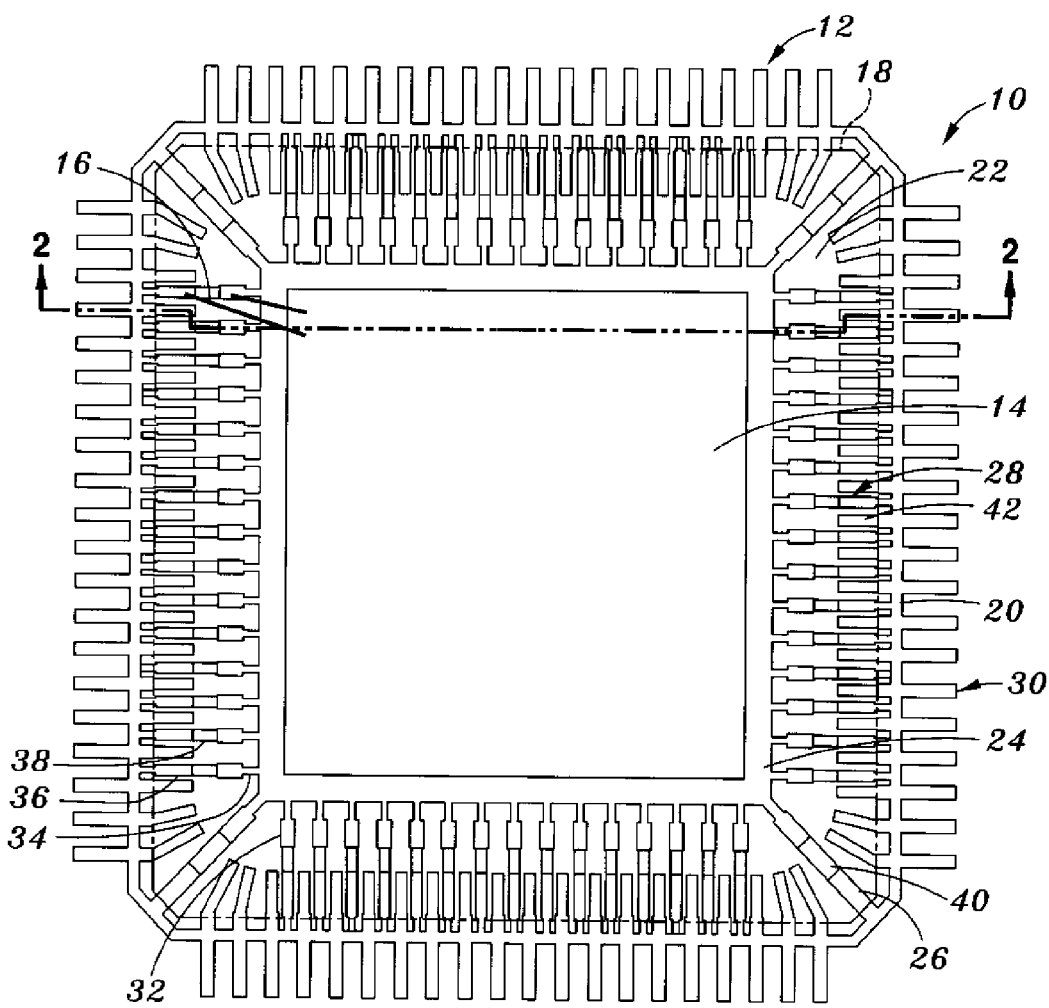
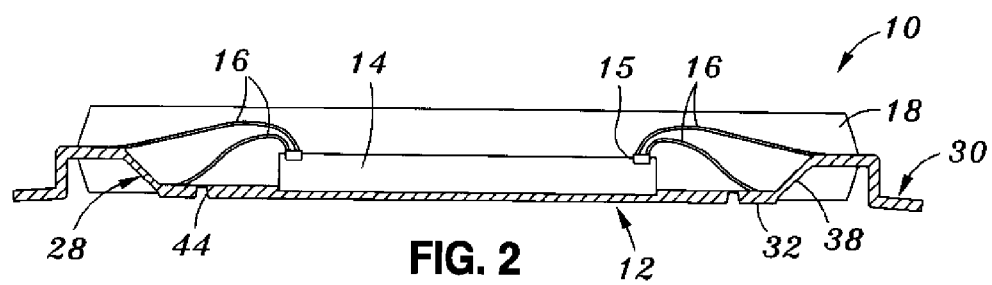

SIDE LEADED, BOTTOM EXPOSED PAD AND BOTTOM EXPOSED LEAD FUSION QUAD FLAT SEMICONDUCTOR PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to an increased capacity QFP semiconductor package which includes a certain exposed leads and an exposed die pad on the bottom surface of the package body thereof 2. Description of the Related Art Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body.

One type of semiconductor package commonly known in the electronics field is referred to as a quad flat pack (QFP) package. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

In the electronics industry and, in particular, in high frequency applications such as cell phones, PDA's and Bluetooth, there is an increasing need for QFP exposed pad packages of increased functional capacity. The present invention provides such a QFP exposed pad package which includes exposed leads and an exposed die pad on the bottom surface of the package body thereof. The semiconductor package of the present invention is provided through the use of standard, low-cost leadframe design techniques. These, as well as other features and attributes of the present invention will be discussed in more detail below.

BRIEF SUMMARY OF THE INVENTION

In accordance with the present invention, there are provided multiple embodiments of a semiconductor package, each embodiment including a uniquely configured leadframe sized and configured to maximize the available number of exposed leads in the semiconductor package. More particularly, each embodiment of the semiconductor package of the present invention includes a generally planar die paddle defining multiple peripheral edge segments and a plurality of leads which are segregated into at least two concentric rows. Connected to the top surface of the die paddle is at least one semiconductor die which is electrically connected to at least some of the leads of each row. At least portions of the die paddle, the leads, and the semiconductor die are encapsulated by a package body, the bottom surfaces of the die paddle and the leads of at least one row thereof being exposed in a common exterior surface of the package body. The leadframe of each embodiment of the semiconductor package is fabricated in accordance with standard, low-cost forming techniques, with sawing or similar cutting procedures being completed during the fabrication of the semiconductor package which effectively electrically isolate various sets of the leads from each other within the completed semiconductor package. The semiconductor package of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 1 is a top plan view of a semiconductor package constructed in accordance with a first embodiment of the present invention, the package body being shown in phantom to facilitate the depiction of the leadframe and semiconductor die thereof;

FIG. 2 is a cross-sectional view of the semiconductor package of the first embodiment of the present invention taken along line 2-2 of FIG. 1;

Common reference numerals are used throughout the drawings and detailed description to indicate like elements.

DETAILED DESCRIPTION OF THE INVENTION

Figure 3:
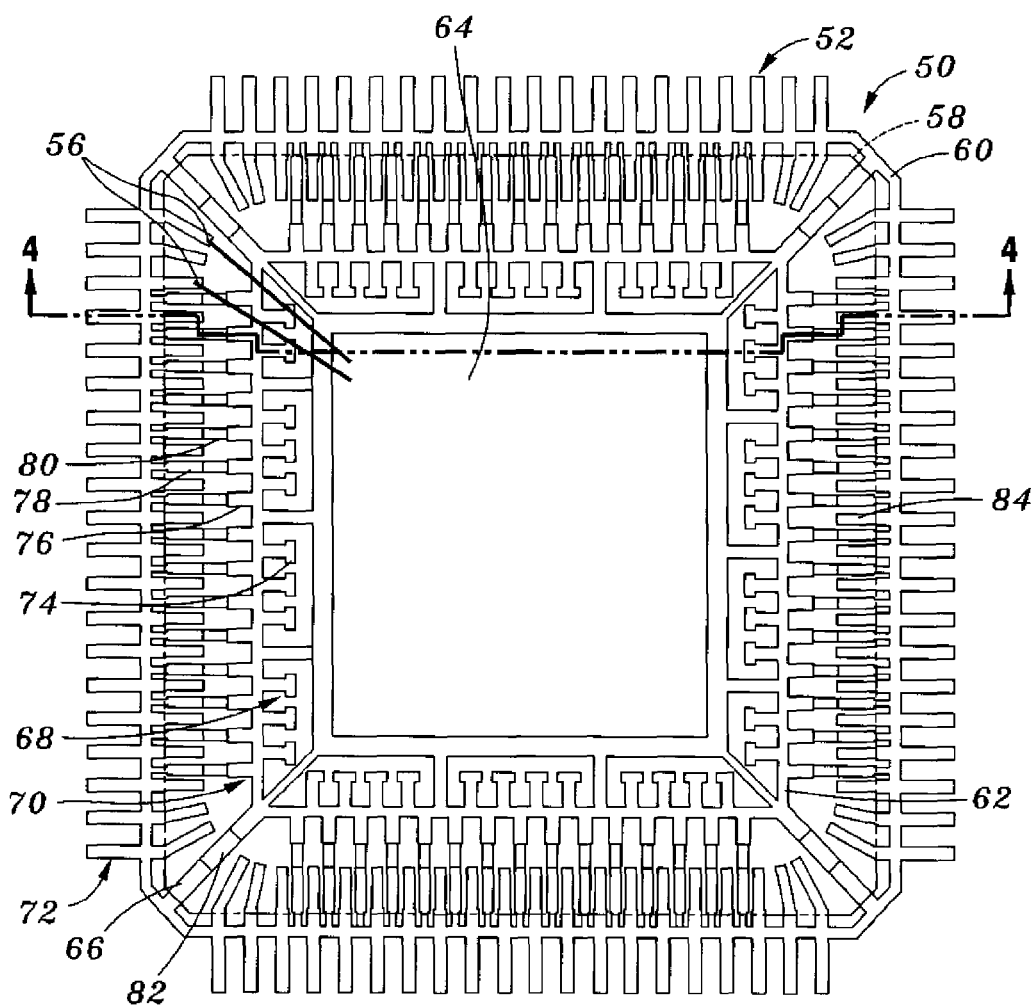
FIG. 3 is a top plan view of a semiconductor package constructed in accordance with a second embodiment of the present invention, the package body being shown in phantom to facilitate the depiction of the leadframe and semiconductor die thereof.

Referring now to the drawings wherein the showings are for purposes of illustrating various embodiments of the present invention only, and not for purposes of limiting the same, FIGS. 1 and 2 depict a semiconductor package 10 constructed in accordance with a first embodiment of the present invention. The major structural elements of the semiconductor package 10 include a leadframe 12, a semiconductor die 14 attached to the leadframe 12 and electrically connected thereto by conductive wires 16, and a package body 18 which fully encapsulates the semiconductor die 14 and wires 16, and partially encapsulates the leadframe 12 in a manner which will be described in more detail below. In FIG. 1, the outline of the package body 18 of the semiconductor package 10 is shown in phantom so as to provide an unobstructed view of the leadframe 12 and semiconductor die 14 attached thereto through the use of the wires 16.

The leadframe 12 of the semiconductor package 10 includes a peripheral outer dambar 20 which defines a central opening 22. Located within the central opening 22 is a generally quadrangular die paddle 24 of the leadframe 12. The die paddle 24 defines opposed, generally planar top and bottom paddle surfaces, and is connected to the dambar 20 by a plurality of tie bars 26 which extend diagonally from respective ones of the four corners defined by the die paddle 24.

In addition to the die paddle 24, the leadframe 12 of the semiconductor package 10 comprises a plurality of first leads 28 which are each connected to both the die paddle 24 and the dambar 20, and a plurality of second leads 30 which are each connected to the dambar 20. As seen in FIG. 1, the first leads 28 are segregated into four sets, with the first leads 28 of each set extending along a respective one of the four peripheral edge segments defined by the die paddle 24. Similarly, the second leads 30 are also segregated into four sets, with the second leads 30 of each set also extending along a respective one of the four peripheral edge segments defined by the die paddle 24 in spaced relation thereto. Thus, the first and second leads 28, 30 are generally arranged as two concentric rings, the first leads 28 defining an inner ring which is circumvented or circumscribed by the outer ring defined by the second leads 30. As further seen in FIG. 1, the first and second leads 28, 30 are arranged in a staggered or offset relationship such that a portion of each first lead 28 of each set thereof extends between and in spaced relation to a respective pair of the second leads 30 of the corresponding set thereof.

In the semiconductor package 10, each of the first leads 28 includes an enlarged pad portion 32 which defines opposed, generally planar top and bottom pad surfaces. In each first lead 28, protruding from the inner end of the pad portion 32 (which is closest to the die paddle 24) is an inner tie bar portion 34 which is used to operatively connect the pad portion 32 to the adjacent peripheral edge segment of the die paddle 24. Protruding from the opposite, outer end of the pad portion 32 is an outer tie bar portion 36 which is used to operatively connect the pad portion 32 to the dambar 20. Thus, the pad portion 32 of each first lead 28 is effectively suspended within the central opening 22 and maintained in a prescribed position therein by the inner and outer tie bar portions 34, 36 thereof which, as indicated above, are integrally connected to the die paddle 24 and dambar 20 of the leadframe 12, respectively. It is contemplated that the outer tie bar portion 36 of each first lead 28 will be formed to include a downset 38 therein such that the pad portion 32 and that segment of the corresponding outer tie bar portion 36 extending between the downset 38 and the dambar 20 will extend along respective ones of a spaced, substantially parallel pair of planes. Similarly, it is contemplated that each tie bar 26 will be formed to include a downset 40 such that the segment of each tie bar 26 between the downset 40 and the die paddle 24 and that segment of the same tie bar 26 between the downset 40 and the dambar 20 will likewise extend along respective ones of a spaced, generally parallel pair of planes.

Each of the second leads 30 of the leadframe 12 is integrally connected to only the dambar 20 of the leadframe 12 as indicated above, and as shown in FIG. 1. Additionally, each second lead 30 defines an inner end portion 42 having a width which is slightly less than the width of the remainder thereof. In this regard, the inner end portions 42 of the majority of the second leads 30 of each set are disposed between the outer tie bar portions 36 of a corresponding pair of the first leads 28 in the manner also shown in FIG. 1, the inner end portion 42 terminating at approximately the outer and/or the inner, distal ends of the downsets 38 of the corresponding pair of first leads 28. The reduced width of the inner end portions 42 of the second leads 30, coupled with the reduced width of the outer tie bar portion 36 relative to the pad portion 32 in each first lead 28, effectively creates a sufficient pitch or clearance between each of the interleaved sets of the first and second leads 28, 30. As further seen in FIG. 1, the inner end portions 42 of those second leads 30 disposed proximate the tie bars 26 each preferably have an angled or sloped configuration, extending toward a respective one of the peripheral edge segments defined by the die paddle 24.

As indicated above, each of the first leads 20 is formed to include the downset 38, with each of the tie bars 26 likewise being formed to include the downset 40. As a result, the die paddle 24 of the leadframe 12 resides on a plane which is disposed below the plane of the dam bar 20 and hence the second leads 30 integrally connected thereto. More particularly, the die paddle 24 and pad portions 32 of the first leads 28 reside on a first plane, with the dam bar 20, second leads 30, and those portions of the first leads 28 extending between the downsets 38 and dambar 20 residing on a second plane, such first and second planes being disposed in spaced, generally parallel relation to each other. It is contemplated that the top pad surfaces of the pad portions 32 and the top paddle surface of the die paddle 24 may extend in generally co-planar relation to each other, and that the bottom pad surfaces of the pad portions 32 and the bottom paddle surface of the die paddle 24 may likewise extend in generally co-planar relation to each other.

The leadframe 12 as shown in FIG. 1 is preferably fabricated from a conventional metal material, such as copper, copper alloy, steel plated with copper, or a functional equivalent. However, those of ordinary skill in the art will recognize that the present invention is not limited to any particular material for the leadframe 12. Additionally, the number of first and second leads 28, 30 shown in FIG. 1 is for illustrative purposes only, and may be modified according to application field. Along these lines, the first and second leads 28, 30 may have designs or configurations varying from those shown in FIG. 1 without departing from the spirit and scope of the present invention. For example, rather than each pad portion 32 having a generally rectangular configuration as shown in FIG. 1, each such pad portion 32 may be formed to have a generally square configuration. Additionally, though the first and second leads 28, 30 are shown as each being segregated into four sets, it will be recognized that fewer sets of the first and second leads 28, 30 may be provided, and may be arranged along any combination of two or three of the peripheral sides of the die paddle 24. Moreover, less than four tie bars 26 may be included in the leadframe 12, extending to respective corners of the die paddle 24 in any combination. Indeed, due to the connection of each of the first leads 28 to both the die paddle 24 and dam bar 28 through the use of the inner and outer tie bar portions 34, 36 thereof, it is contemplated that the tie bars 26 may be eliminated from the leadframe 12 in their entirety. It is further contemplated that the leadframe 12 may be fabricated through the implementation of a chemical etching process or alternatively a mechanical stamping process. The above-described potential structural variations are also applicable to the leadframes of the alternative embodiments of the semiconductor package which will be described in more detail below.

In the semiconductor package 10, the semiconductor die 14 is attached to the top paddle surface of the die paddle 24, such attachment preferably being facilitated through the use of a suitable die attach material, such as an adhesive. Included on the top surface of the semiconductor die 14 is a plurality of bond pads or terminals 15. In the semiconductor package 10, these terminals 15 of the semiconductor die 14 are electrically connected to respective ones of the first and second leads 28, 30 through the use of the conductive wires 16. In FIG. 1, only a few exemplary wires 16 are depicted, those of ordinary skill in the art recognizing that the semiconductor package 10 will typically include wires 16 in a suitable number which effectively electrically connects the semiconductor die 14 to virtually all of the first and second leads 28, 30 included in the leadframe 12. It is contemplated that for each first lead 28, a corresponding wire 16 will be extended to the top pad surface of the pad portion 32 and/or to the extended tie bar portion 36 thereof. For each second lead 30, it is contemplated that the corresponding wire 16 may be extended to any portion of the top lead surface thereof which is ultimately covered by the package body 18 in the manner described below. The conductive wires 16 may be fabricated from aluminum, copper, gold, silver, or a functional equivalent. However, those of ordinary skill in the art will recognize that the present invention is not limited to any particular material for the wires 16.

In the semiconductor package 10, the die paddle 24, the first and second leads 28, 30, the semiconductor die 14 and the conductive wires 16 are encapsulated or covered by an encapsulant material which, upon hardening, forms the package body 18 of the semiconductor package 10. In the completed semiconductor package 10, the generally planar bottom pad surfaces of the pad portions 32 of each of the first leads 28 are exposed in and substantially flush with a generally planar bottom surface defined by the fully formed package body 18. Also exposed in and substantially flush with the bottom surface of the package body 18 is the generally planar bottom paddle surface of the die paddle 24. Distal portions of the second leads 30 protrude from respective ones of multiple side surfaces defined by the package body 18. These exposed portions of the second leads 30 are preferably bent so as to impart a generally gull-wing configuration thereto in the manner shown in FIG. 2. Other than for the bottom pad surfaces of the pad portions 32 of the first leads 28 and those portions of the second leads 30 protruding from the side surfaces of the package body 18, it is contemplated that the remainder of each of the first and second leads 28, 30 will be covered by the package body 18.

The semiconductor package 10 as shown in FIG. 1 is not depicted in a fully fabricated state since the dambar 20 and inner tie bar portions 34 have not yet been removed from the leadframe 12 to effectively facilitate the electrical isolation of the first leads 28 from each other and the electrical isolation of the second leads 30 from each other. In this regard, subsequent to the formation of the package body 18 in the above-described manner, it is contemplated that the package body 18 will be subjected to a partial saw process. In this partial sawing process, a saw blade is penetrated into the bottom surface of the package body 18 to a depth and along axes which facilitate the severing or removal of the inner tie bar portions 34 of the first leads 28, thus effectively separating the first leads from the die paddle 24 and electrically isolating the first leads 28 from each other. As will be recognized, the artifact which remains in the bottom surface of the package body 18 as a result of such partial sawing or singulation step are four elongate, generally straight grooves 44 which are arranged in a generally quadrangular pattern. Prior to the bending of the exposed portions of the second leads 30 as described above and subsequent to the formation of the package body 18, it is contemplated that a conventionally known debarring process will be implemented to remove the dambar 20 as needed to electrically isolate the first leads 28 and the second leads 30 from each other. Advantageously, in the semiconductor package 10, the connection of the first and second leads 28, 30 to the common dambar 20 and the further connection of the first leads 28 to the die paddle 24 maintains tight positional consistency in relation to the first leads 28, and in particular the pad portions 32 thereof. Further, the encapsulation of the downsets 38 of the first leads 28 by the package body 18 facilitates the anchoring or locking of the first leads 28 to the package body 18, thus eliminating the need to form any locking features therein via a half-etching or coining technique.

Figure 4:
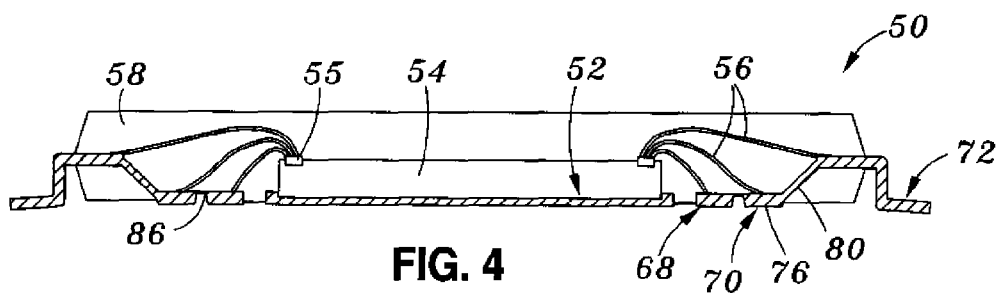
FIG. 4 is a cross-sectional view of the semiconductor package of the second embodiment of the present invention taken along line 4-4 of FIG. 3.

Referring now to FIGS. 3 and 4, there is depicted a semiconductor package 50 constructed in accordance with a second embodiment of the present invention. The major structural elements of the semiconductor package 50 include a leadframe 52, a semiconductor die 54 attached to the leadframe 52 and electrically connected thereto by conductive wires 56, and a package body 58 which fully encapsulates the semiconductor die 54 and wires 56, and partially encapsulates the leadframe 52 in a manner which will be described in more detail below. In FIG. 4, the outline of the package body 58 of the semiconductor package 50 is shown in phantom so as to provide an unobstructed view of the leadframe 52 and semiconductor package 54 attached thereto through the use of the wires 56.

The leadframe 52 of the semiconductor package 50 includes a peripheral outer dambar 60. Located within the outer dambar 60 is a continuous, generally quadrangular tie ring 62. Disposed within the tie ring 62 is a generally quadrangular die paddle 64 of the leadframe 52. The die paddle 64 defines opposed, generally planar top and bottom paddle surfaces, and is connected to the both the tie ring 62 and the dambar 60 by a plurality of tie bars 66 which extend diagonally from respective ones of the four corners defined by the die paddle 64.

In addition to the die paddle 64, the leadframe 52 of the semiconductor package 50 comprises a plurality of first leads 68 which are each integrally connected to the tie ring 62 and extend inwardly toward the die paddle 64 in spaced relation thereto, and a plurality of second leads 70 which are each integrally connected to and extend between the tie ring 62 and the dambar 60. In addition to the first and second leads 68, 70, the leadframe 52 includes a plurality of third leads 72 which are each integrally connected to the dambar 60. As seen in FIG. 3, the first leads 68 and the second leads 70 are each segregated into four sets, with the first leads 68 and the second leads 70 of each set extending along a respective one of the four peripheral edge segments defined by the die paddle 64. In the leadframe 52, certain ones of the first leads 68 of each set are of increased length and are also each integrally connected to the die paddle 64 in addition to the tie ring 62, such first leads 68 defining signal pins which extend between the tie ring 62 and the die paddle 64. The third leads 72 are also segregated into four sets, with the third leads 72 of each set extending along a respective one of the four peripheral edge segments defined by the die paddle 64 in spaced relation thereto. Thus, the first, second and third leads 68, 70, 72 are generally arranged as three concentric rings, the first leads 68 defining an inner ring which is circumvented or circumscribed by a middle ring defined by the second leads 70, such middle ring itself being circumvented by an outer ring defined by the third leads 72. As further seen in FIG. 3, the second and third leads 70, 72 are arranged in a staggered or offset relationship such that a portion of each second lead 70 of each set thereof extends between and in spaced relation to a respective pair of the third leads 72 of the corresponding set thereof. Each set of first leads 68 is also staggered or offset relative to the corresponding set of second leads 70.

In the semiconductor package 50, each of the first leads 68 defined opposed, generally planar top and bottom leads surfaces. Additionally, each of the first leads 68 other than for those which are integrally connected to the die paddle 64 defines an enlarged inner end or tip structure 74 which may be formed through the implementation of a partial (half) etching procedure or a coining procedure, and is used to provide a locking feature to strengthen the engagement between the first leads 68 and the package body 58 subsequent to the singulation or removal of the tie ring 62 as will be discussed in more detail below. If such locking feature is provided, it is contemplated that each first lead 68 will include a shoulder or shelf which is recessed relative to the bottom lead surface thereof and defines the bottom surface of the tip structure 74, such shoulder or shelf further being disposed in opposed relation to that portion of the top lead surface of the corresponding first lead 68 which defines the top surface of the tip structure 74. Each of the second leads 70 includes an enlarged pad portion 76 which defines opposed, generally planar top and bottom pad surfaces. In each second lead 70, the inner end of the pad portion 76 (which is closest to the die paddle 24) is integrally connected to the tie ring 62. Protruding from the opposite, outer end of the pad portion 76 of each second lead 70 is a tie bar portion 78 which is used to operatively connect the pad portion 76 to the dambar 60. It is contemplated that the tie bar portion 78 of each second lead 70 will be formed to include a downset 80 therein such that the pad portion 76 and that segment of the corresponding tie bar portion 78 extending between the downset 80 and the dambar 60 will extend along respective ones of a spaced, substantially parallel pair of planes. Similarly, it is contemplated that each tie bar 66 will be formed to include a downset 82 such that the segment of each tie bar 66 between the downset 82 and the die paddle 64 and that segment of the same tie bar 66 between the downset 82 and the dambar 60 will likewise extend along respective ones of a spaced, generally parallel pair of planes.

Each of the third leads 72 of the leadframe 52 is integrally connected to only the dambar 60 of the leadframe 52 as indicated above, and as shown in FIG. 3. Each third lead 72 defines an inner end portion 84 having a width which is slightly less than the width of the remainder thereof. In this regard, the inner end portions 84 of the majority of the third leads 72 of each set are disposed between the tie bar portions 78 of a corresponding pair of the second leads 70 in the manner also shown in FIG. 3, the inner end portion 84 terminating at approximately the outer and/or the inner, distal ends of the downsets 80 of the corresponding pair of second leads 70. The reduced width of the inner end portions 84 of the third leads 72, coupled with the reduced width of the tie bar portion 78 relative to the pad portion 74 in each second lead 70, effectively creates a sufficient pitch or clearance between each of the interleaved sets of the second and third leads 70, 72. As further seen in FIG. 3, the inner end portions 84 of those third leads 72 disposed proximate the tie bars 66 each preferably have an angled or sloped configuration, extending toward a respective one of the peripheral edge segments defined by the die paddle 64.

As indicated above, each of the second leads 70 is formed to include the downset 80, with each of the tie bars 66 likewise being formed to include the downset 82. As a result, the die paddle 64 of the leadframe 52 resides on a plane which is disposed below the plane of the dam bar 60 and hence the third leads 72 integrally connected thereto. More particularly, the die paddle 64, the first leads 68, the tie ring 62 and pad portions 76 of the second leads 70 reside on a first plane, with the dam bar 60, third leads 72, and those portions of the second leads 70 extending between the downsets 80 and dambar 60 residing on a second plane, such first and second planes being disposed in spaced, generally parallel relation to each other. It is contemplated that the top lead surfaces of the first leads 68, the top pad surfaces of the pad portions 76 and the top paddle surface of the die paddle 64 may extend in generally co-planar relation to each other, and that the bottom lead surfaces of the first leads 68, the bottom pad surfaces of the pad portions 76 and the bottom paddle surface of the die paddle 64 may likewise extend in generally co-planar relation to each other.

The leadframe 52 as shown in FIG. 3 is preferably fabricated from a conventional metal material, such as copper, copper alloy, steel plated with copper, or a functional equivalent. However, those of ordinary skill in the art will recognize that the present invention is not limited to any particular material for the leadframe 52. Additionally, the number of first, second and third leads 68, 70, 72 shown in FIG. 3 is for illustrative purposes only, and may be modified according to application field. Along these lines, the first, second and third leads 68, 70, 72 may have designs or configurations varying from those shown in FIG. 3 without departing from the spirit and scope of the present invention. For example, rather than each pad portion 76 having a generally rectangular configuration as shown in FIG. 3, each such pad portion 76 may be formed to have a generally square configuration. Additionally, though the first, second and third leads 68, 70, 72 are shown as each being segregated into four sets, it will be recognized that fewer sets of the first, second and third leads 68, 70, 72 may be provided, and may be arranged along any combination of two or three of the peripheral sides of the die paddle 64. Moreover, less than four tie bars 66 may be included in the leadframe 52, extending to respective corners of the die paddle 64 in any combination. Due to the connection of each of the first and second leads 68, 70 to the tie ring 62 which is itself connected to the tie bars 66, it is contemplated that none of those first leads 68 defining signal pins need be connected to the die paddle 64, all of the first leads 68 thus being identically configured. It is further contemplated that the leadframe 52 may be fabricated through the implementation of a chemical etching process or alternatively a mechanical stamping process.

In the semiconductor package 50, the semiconductor die 54 is attached to the top paddle surface of the die paddle 64, such attachment preferably being facilitated through the use of a suitable die attach material, such as an adhesive. Included on the top surface of the semiconductor die 54 is a plurality of bond pads or terminals 55. In the semiconductor package 50, these terminals 55 of the semiconductor die 54 are electrically connected to respective ones of the first, second and third leads 68, 70, 72 through the use of the conductive wires 56. In FIG. 3, only a few exemplary wires 56 are depicted, those of ordinary skill in the art recognizing that the semiconductor package 50 will typically include wires 56 in a suitable number which effectively electrically connects the semiconductor die 54 to virtually all of the first, second and third leads 68, 70, 72 included in the leadframe 52. It is contemplated that for each first lead 68, the corresponding wire 56 may be extended to any portion of the top lead surface thereof. For each second lead 70, it is contemplated that the corresponding wire 56 will be extended to the extended tie bar portion 78 and for to the top pad surface of the pad portion 76 thereof. For each third lead 72, it is contemplated that the corresponding wire 56 may be extended to any portion of the top lead surface thereof which is ultimately covered by the package body 58 in the manner described below. The conductive wires 56 may be fabricated from aluminum, copper, gold, silver, or a functional equivalent. However, those of ordinary skill in the art will recognize that the present invention is not limited to any particular material for the wires 56.

Figure 12:
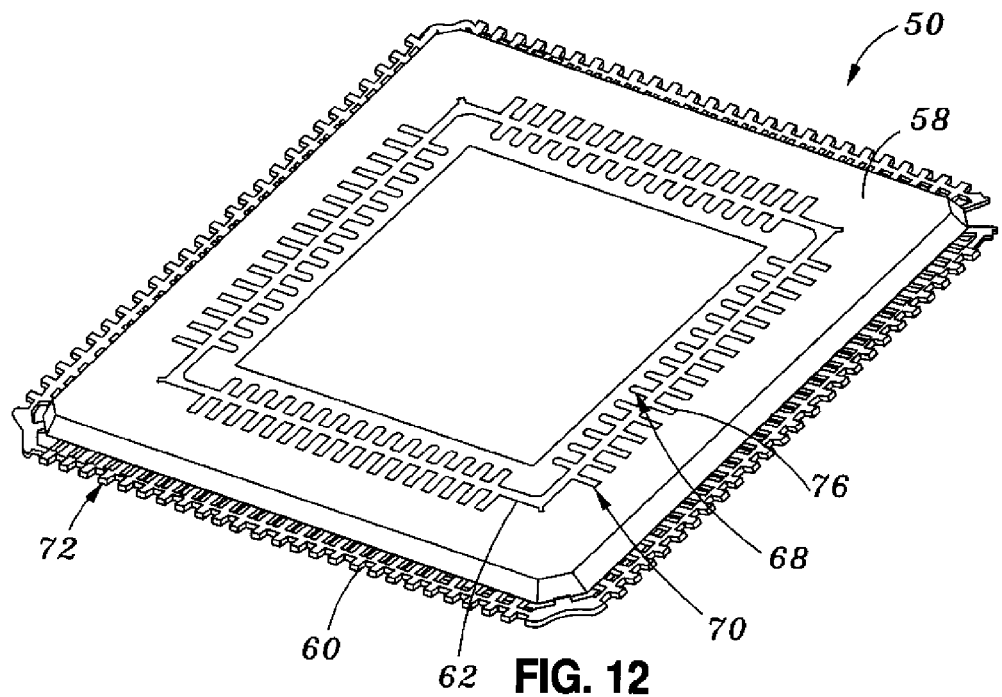
FIG. 12 is a bottom perspective view of a partially fabricated semiconductor package constructed in accordance with the second embodiment of the present invention.

Referring now to FIGS. 4 and 12-15, in the semiconductor package 50, the die paddle 64, the first, second and third leads 68, 70, 72, the semiconductor die 54 and the conductive wires 56 are encapsulated or covered by an encapsulant material which, upon hardening, forms the package body 58 of the semiconductor package 50. In the completed semiconductor package 50, the generally planar bottom lead surfaces of the first leads 68 and the generally planar bottom pad surfaces of the pad portions 76 of the second leads 70 are exposed in and substantially flush with a generally planar bottom surface defined by the fully formed package body 58 (FIGS. 3 and 12). Also exposed in and substantially flush with the bottom surface of the package body 58 are the generally planar bottom paddle surface of the die paddle 64 and the generally planar bottom ring surface of the tie ring 62. Distal portions of the third leads 72 protrude from respective ones of multiple side surfaces defined by the package body 58. These exposed portions of the third leads 72 are preferably bent so as to impart a generally gull-wing configuration thereto in the manner shown in FIGS. 3, 14 and 15. Other than for the bottom lead surfaces of the first leads 68, the bottom pad surfaces of the pad portions 76 of the second leads 70 and those portions of the third leads 72 protruding from the side surfaces of the package body 58, it is contemplated that the remainder of each of the first, second and third leads 68, 70, 72 will be covered by the package body 58.

Figure 13:
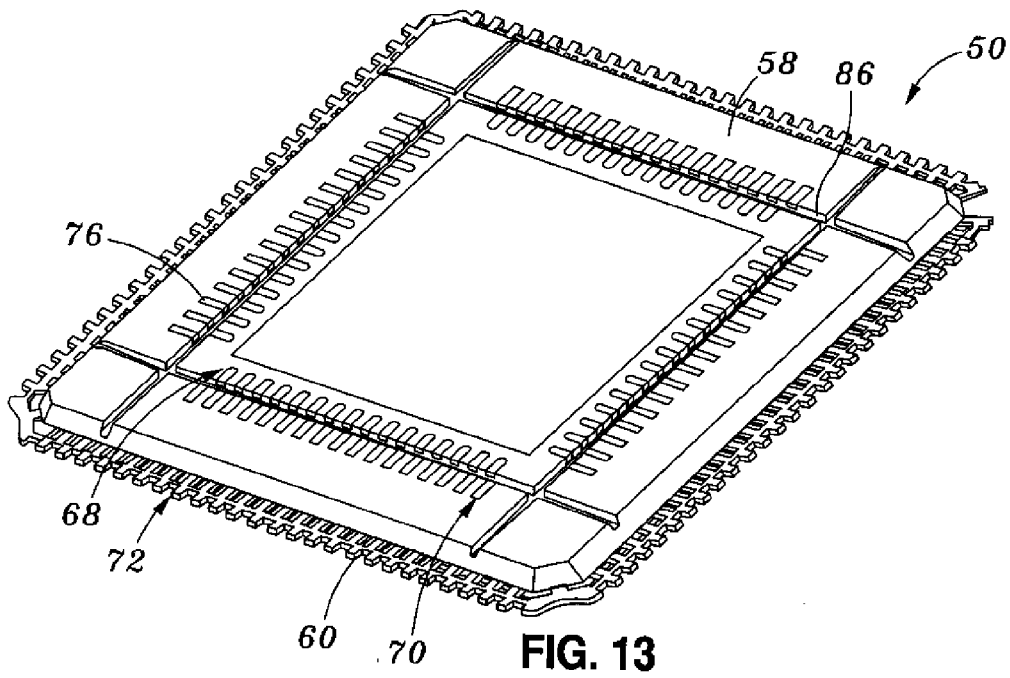
FIG. 13 is a bottom perspective view of a partially fabricated semiconductor package constructed in accordance with the second embodiment of the present invention, further depicting the package body subsequent to the completion of a partial saw process.
Figure 14:
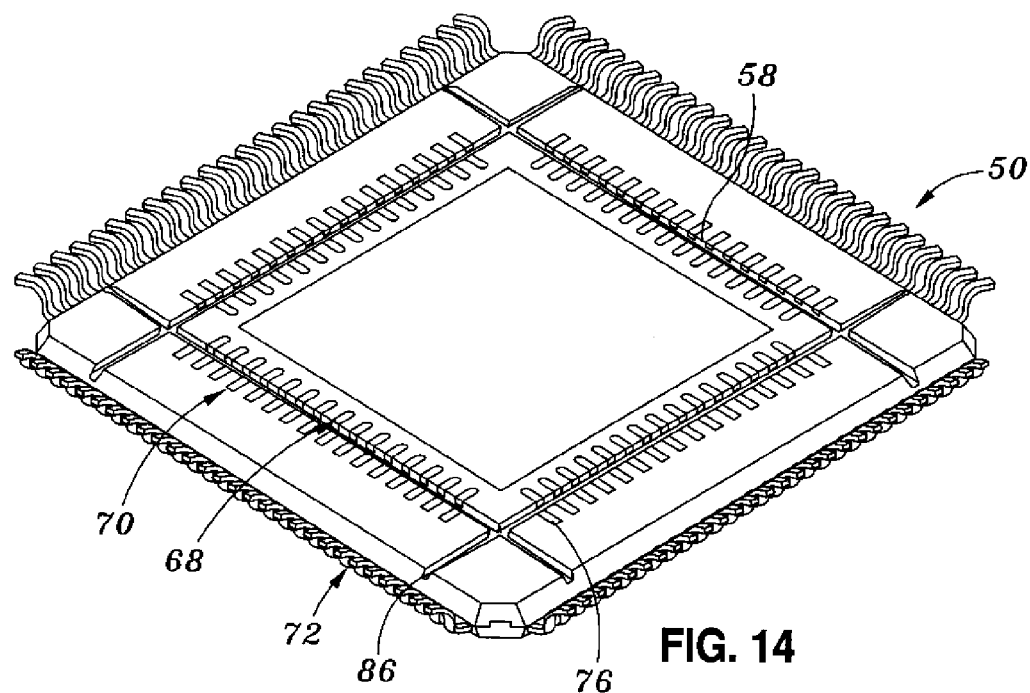
FIG. 14 is a bottom perspective view of a fully fabricated semiconductor package constructed in accordance with the second embodiment of the present invention.
Figure 15:
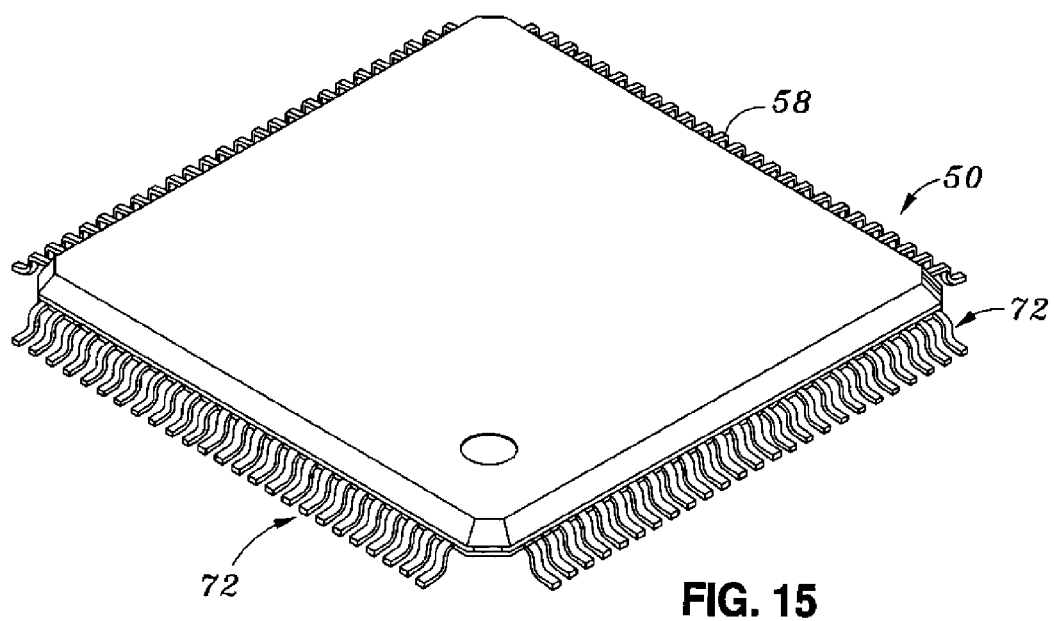
FIG. 15 is a top perspective view of the fully fabricated semiconductor package shown in FIG. 14.

The semiconductor package 50 as shown in FIG. 12 is not depicted in a fully fabricated state since the dambar 60 and tie ring 62 have not yet been removed from the leadframe 52 to effectively facilitate the electrical isolation of the first, second and third leads 68, 70, 72 from each other. In this regard, subsequent to the formation of the package body 58 in the above-described manner, it is contemplated that the package body 58 will be subjected to a partial saw process. In this partial sawing process, a saw blade is penetrated into the bottom surface of the package body 58 to a depth and along axes which facilitate the severing or removal of the tie ring 62, thus electrically isolating the first leads 68 from each other and from the second and third leads 70, 72. However, it will be recognized that the removal of the tie ring 62 does not electrically isolate any first leads 68 which define signal pins and remain integrally connected to the die paddle 64. The artifact which remains in the bottom surface of the package body 18 as a result of such partial sawing or singulation step are four elongate, generally straight grooves 86 which are arranged in a generally quadrangular pattern as shown in FIGS. 13 and 14. Prior to the bending of the exposed portions of the third leads 72 as described above and subsequent to the formation of the package body 58, it is contemplated that a conventionally known debarring process will be implemented to remove the dambar 60 as needed to electrically isolate the third leads 72 and the second leads 78 from each other. Advantageously, in the semiconductor package 50, the connection of the first and second leads 68, 70 to the common tie ring 62 and the connection of the second and third leads 70, 72 to the common dambar 60 maintains tight positional consistency in relation to the relative orientations of the first, second and third leads 68, 70, 72. Further, the encapsulation of the downsets 80 of the second leads 70 by the package body 58 facilitates the anchoring or locking of the second leads 70 to the package body 58, thus eliminating the need to form any locking features therein via a half-etching or coining technique. As indicated above, it is contemplated that each of the first leads 68 will be formed to include the locking tip structure 74 to facilitate the anchoring thereof to the package body 58.

Figure 5:
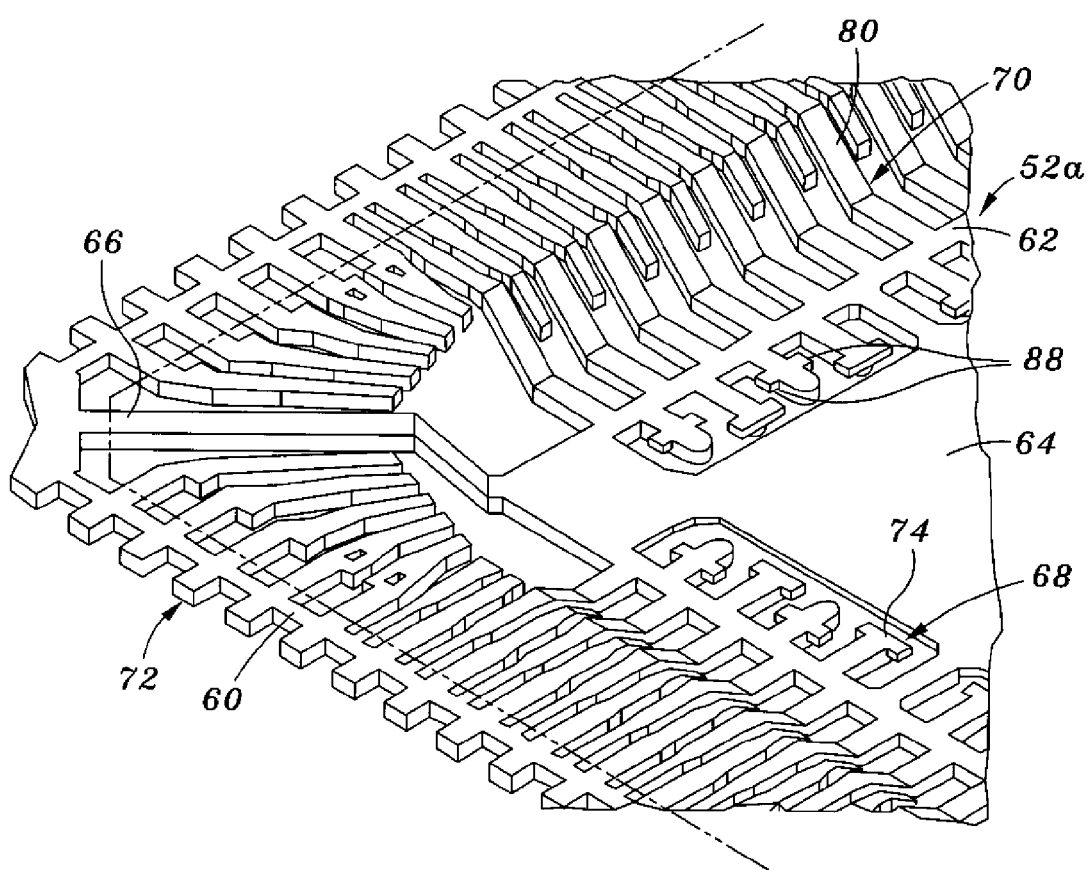
FIG. 5 is a partial, top perspective view of a first variant of the leadframe shown in FIG. 3.

Referring now to FIG. 5, there is shown a leadframe 52a which comprises a first relatively minor variation of the leadframe 52 shown and described above. As previously indicated, each of the first leads 68 of the leadframe 52, other than for those which are integrally connected to the die paddle 64, defines an enlarged inner end or tip structure 74. Such tip structure 74 is used to provide a locking feature to strengthen the engagement between the corresponding first lead 68 and the package body 58. In the variation of the leadframe 52a shown in FIG. 5, of those first leads 68 of each set which are not integrally connected to the die paddle 64 and thus do not define signal pins, every other one of such first leads 68 includes the above-described tip structure 74. However, those remaining first leads 68 which do not define signal pins and do not include the tip structure 74 are each formed to include an opposed pair of laterally extending ear portions 88. It is contemplated that such ear portions 88 will also be formed through the implementation of a half etching procedure, and used to provide a locking feature to strengthen the engagement between those first leads 68 including such ear portions 88 and the package body 58. For those first leads 68 including the ear portions 88 as an alternative to the above-described tip structure 74, it is contemplated that such first leads 68 will include an opposed pair of shoulders or shelves which are recessed relative to the bottom lead surface thereof and define the bottom surfaces of respective ones of the ear portions 88, such shoulders or shelves further being disposed in opposed relation to those portions of the top lead surface of the corresponding first lead 68 which defines the top surfaces of the ear portions 88.

Figure 5A:
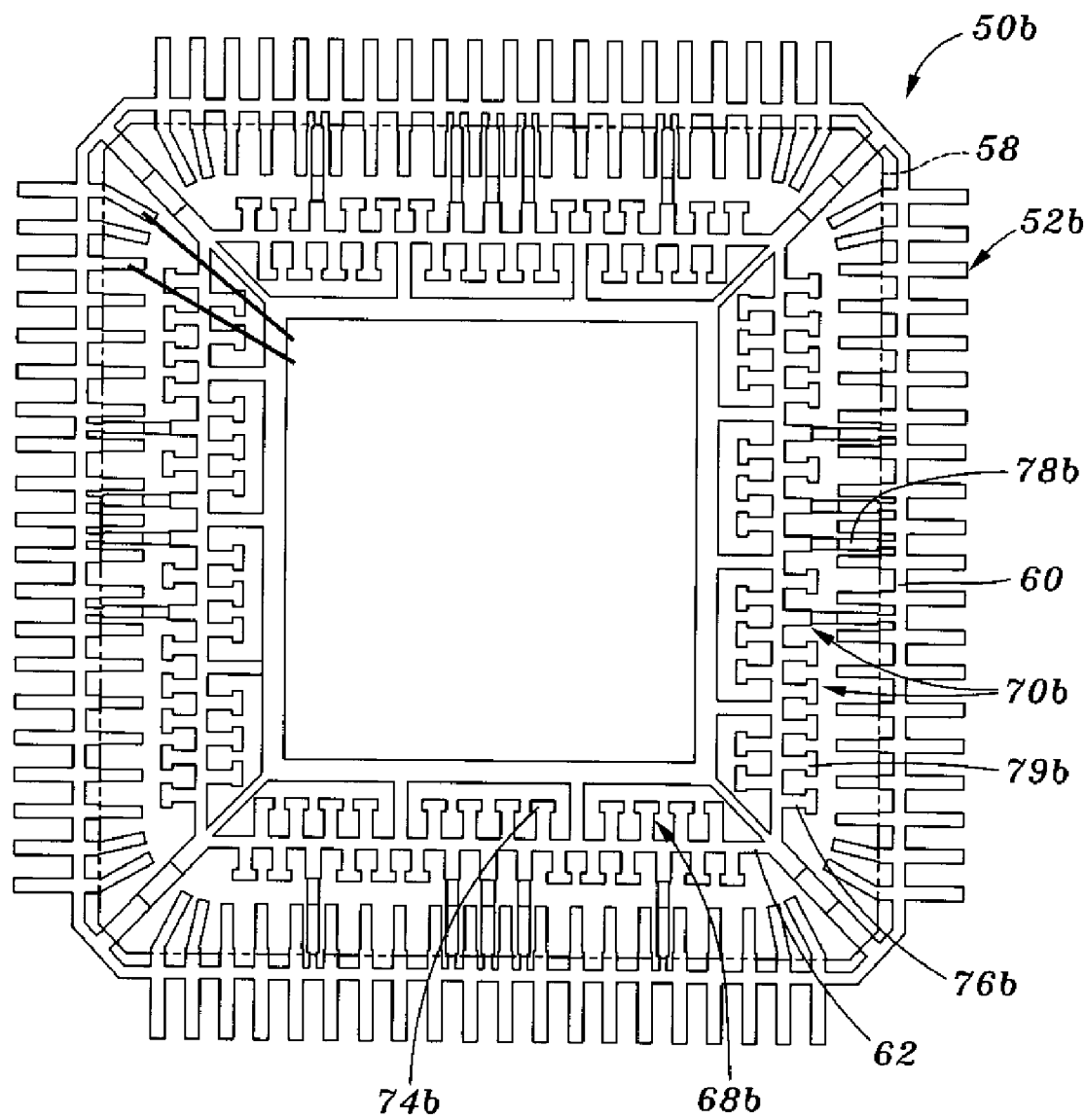
FIG. 5A is a top plan view of a semiconductor package constructed to include a second variant of the leadframe shown in FIG. 3, the package body being shown in phantom to facilitate the depiction of the leadframe and semiconductor die of such semiconductor package.

Referring now to FIG. 5A, there is shown a semiconductor package 50b which is substantially similar in construction to the above-described semiconductor package 50 shown in FIG. 3, but includes a leadframe 52b which comprises a second variation of the leadframe 52 shown and described above in relation to the semiconductor package 50. In this regard, only the distinctions between the semiconductor packages 50, 50b, and in particular the leadframes 52, 52b thereof, will be described below. As previously indicated, in the leadframe 50, the inner end of the pad portion 76 of each second lead 70 is integrally connected to the tie ring 62, with the tie bar portion 78 protruding from the opposite, outer end of the pad portion 76 being integrally connected to the dambar 60. In contrast, in the leadframe 52b, only certain ones of the second leads 70b thereof are identically configured to the second leads 70, and thus include a tie bar portion 78b which is integrally connected to the dambar 60. In this regard, the majority of the second leads 70b in the leadframe 50b are identically configured to the first leads 68 of the leadframe 50 (as well as the first leads 68b of the leadframe 50b). Thus, in each of those second leads 70b which is not integrally connected to the dambar 60, the inner end of the pad portion 76b is integrally connected to the tie ring 62, with the tie bar portion 78b being eliminated in favor of an enlarged inner end or tip structure 79b which is identical to the tip structures 74 of the first leads 68 of the leadframe 50 and the tip structures 74b of the first leads 68b of the leadframe 50. Like the tip structures 74, 74b, such tip structures 79b are used to provide a locking feature to strengthen the engagement between the corresponding second lead 70b and the package body 58 of the semiconductor package 50b.

Figure 6:
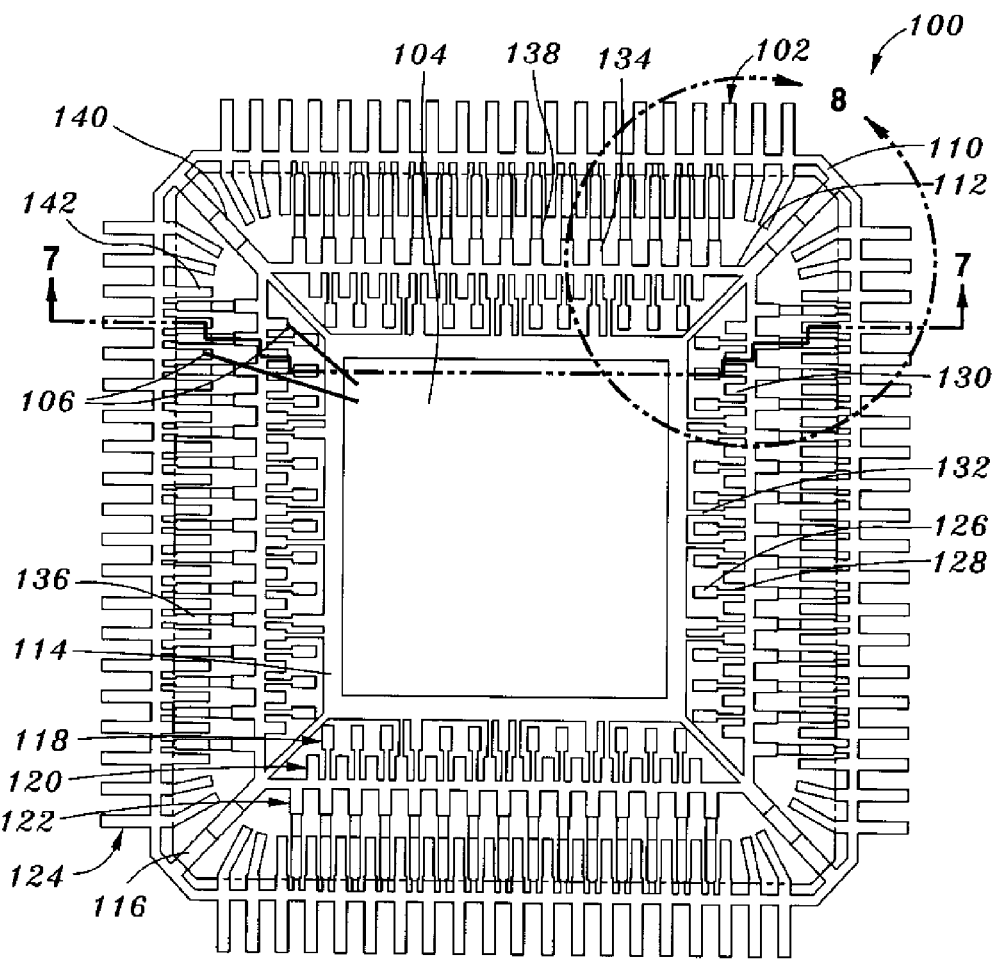
FIG. 6 is a top plan view of a semiconductor package constructed in accordance with a third embodiment of the present invention, the package body being shown in phantom to facilitate the depiction of the leadframe and semiconductor die thereof.
Figure 7:
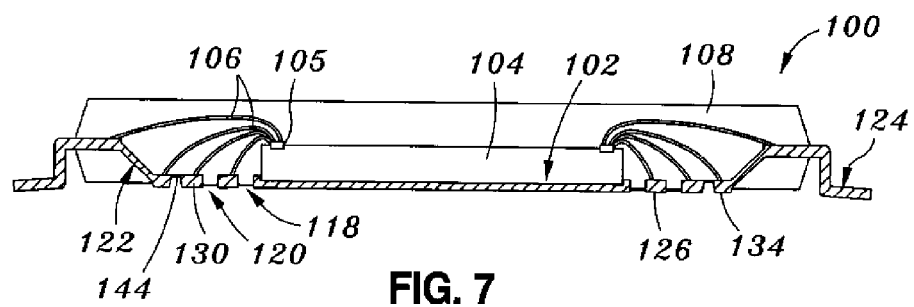
FIG. 7 is a cross-sectional view of the semiconductor package of the third embodiment of the present invention taken along line 7-7 of FIG. 6.
Figure 8:
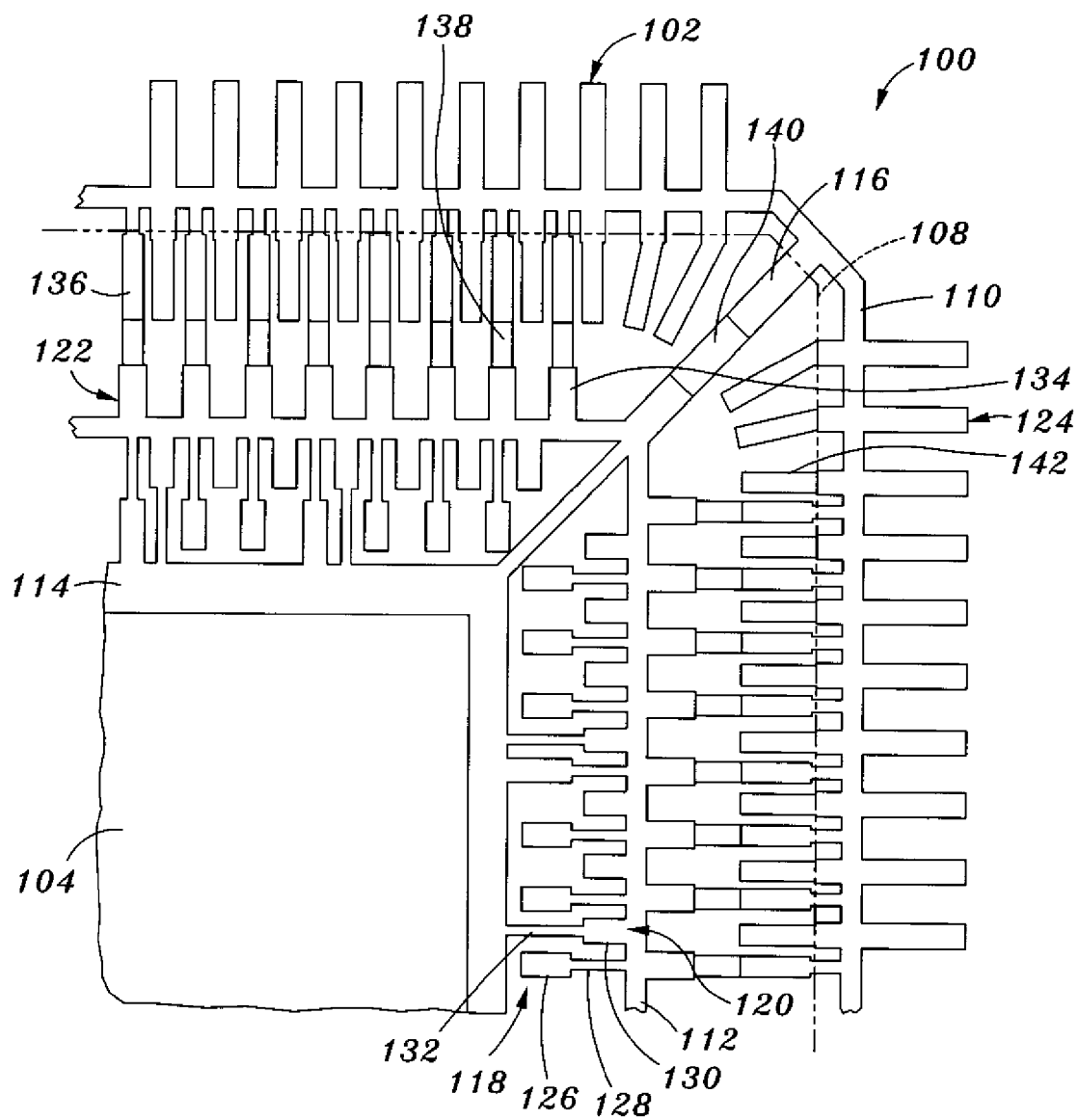
FIG. 8 is an enlargement of the encircled region 8 shown in FIG. 6.

Referring now to FIGS. 6, 7 and 8, there is depicted a semiconductor package 100 constructed in accordance with a third embodiment of the present invention. The major structural elements of the semiconductor package 100 include a leadframe 102, a semiconductor die 104 attached to the leadframe 102 and electrically connected thereto by conductive wires 106, and a package body 108 which fully encapsulates the semiconductor die 104 and wires 106, and partially encapsulates the leadframe 102 in a manner which will be described in more detail below. In FIG. 6, the outline of the package body 108 of the semiconductor package 100 is shown in phantom so as to provide an unobstructed view of the leadframe 102 and semiconductor package 104 attached thereto through the use of the wires 106.

The leadframe 102 of the semiconductor package 100 includes a peripheral outer dambar 110. Located within the outer dambar 110 is a continuous, generally quadrangular tie ring 112. Disposed within the tie ring 112 is a generally quadrangular die paddle 114 of the leadframe 102. The die paddle 114 defines opposed, generally planar top and bottom paddle surfaces, and is connected to the both the tie ring 112 and the dambar 110 by a plurality of tie bars 116 which extend diagonally from respective ones of the four corners defined by the die paddle 114.

In addition to the die paddle 114, the leadframe 102 of the semiconductor package 100 comprises a plurality of first leads 118 which are each integrally connected to the tie ring 112 and extend inwardly toward the die paddle 114. The leadframe 102 also includes a plurality of second leads 120 which are also each integrally connected to the tie ring 112 and extend inwardly toward the die paddle 114, and a plurality of third leads 122 which are each integrally connected to and extend between the tie ring 112 and the dambar 110. Certain ones of the second leads 120 of each set are also integrally connected to the die paddle 114. In addition to the first, second and third leads 118, 120, 122, the leadframe 102 includes a plurality of fourth leads 124 which are each integrally connected to the dambar 110. As seen in FIGS. 6 and 8, the first, second and third leads 118, 120, 122 are each segregated into four sets, with the first, second and third leads 118, 120, 122 of each set extending along a respective one of the four peripheral edge segments defined by the die paddle 114. In the leadframe 102, certain ones of the first leads 118 of each set are of increased length and are also each integrally connected to the die paddle 114 in addition to the tie ring 112, such first leads 118 defining signal pins which extend between the tie ring 112 and the die paddle 114. The fourth leads 124 are also segregated into four sets, with the fourth leads 124 of each set extending along a respective one of the four peripheral edge segments defined by the die paddle 114 in spaced relation thereto. Thus, the first, second, third and fourth leads 118, 120, 122, 124 are generally arranged as four concentric rings, the first leads 118 defining an inner ring which is circumvented or circumscribed by a middle inner ring defined by the second leads 120, such middle inner ring itself being circumvented by a middle outer ring defined by the third leads 122. This middle outer ring is circumvented by an outer ring defined by the fourth leads 124. As further seen in FIG. 6, the first and second leads 118, 120 are arranged in a staggered or offset relationship such that a portion of each first lead 118 of each set thereof extends between and in spaced relation to a respective pair of the second leads 120 of the corresponding set thereof. Similarly, the third and fourth leads 122, 124 are arranged in a staggered or offset relationship such that a portion of each third lead 122 of each set thereof extends between and in spaced relation to a respective pair of the fourth leads 124 of the corresponding set thereof. Each set of second leads 120 is also staggered or offset relative to the corresponding set of third leads 122.

In the semiconductor package 100, each of the first leads 118 includes an enlarged pad portion 126 which defines opposed, generally planar top and bottom pad surfaces. In each first lead 118, protruding from the outer end of the pad portion 126 (which is furthest from the die paddle 114) is a tie bar portion 128 which is used to operatively connect the pad portion 126 to the tie ring 112. Each of the second leads 120 also includes an enlarged pad portion 130 which defines opposed, generally planar top and bottom pad surfaces. In each second lead 120, the outer end of the pad portion 130 (which is furthest from the die paddle 114) is integrally connected to the tie ring 112. Protruding from the opposite, inner end of the pad portion 130 of some of the second leads 120 is a tie bar portion 132 which is used to operatively connect the corresponding pad portion 130 to the die paddle 114. Each of the third leads 122 includes an enlarged pad portion 134 which defines opposed, generally planar top and bottom pad surfaces. In each third lead 122, the inner end of the pad portion 134 (which is closest to the die paddle 114) is integrally connected to the tie ring 112. Protruding from the opposite, outer end of the pad portion 134 of each third lead 122 is a tie bar portion 136 which is used to operatively connect the pad portion 134 to the dambar 110. It is contemplated that the tie bar portion 136 of each third lead 122 will be formed to include a downset 138 therein such that the pad portion 134 and that segment of the corresponding tie bar portion 136 extending between the downset 138 and the dambar 110 will extend along respective ones of a spaced, substantially parallel pair of planes. Similarly, it is contemplated that each tie bar 116 will be formed to include a downset 140 such that the segment of each tie bar 116 between the downset 140 and the die paddle 114 and that segment of the same tie bar 116 between the downset 140 and the dambar 110 will likewise extend along respective ones of a spaced, generally parallel pair of planes.

Each of the fourth leads 124 of the leadframe 102 is integrally connected to only the dambar 110 of the leadframe 102 as indicated above, and as shown in FIGS. 6 and 8. Each fourth lead 124 defines an inner end portion 142 having a width which is slightly less than the width of the remainder thereof. In this regard, the inner end portions 142 of the majority of the fourth leads 124 of each set are disposed between the tie bar portions 136 of a corresponding pair of the third leads 122 in the manner also shown in FIGS. 6 and 8, the inner end portion 142 terminating at approximately the outer and/or inner, distal ends of the downsets 138 of the corresponding pair of third leads 122. The reduced width of the inner end portions 142 of the fourth leads 124, coupled with the reduced width of the tie bar portion 136 relative to the pad portion 134 in each third lead 122, effectively creates a sufficient pitch or clearance between each of the interleaved sets of the third and fourth leads 122, 124. As further seen in FIGS. 6 and 8, the inner end portions 142 of those fourth leads 124 disposed proximate the tie bars 116 each preferably have an angled or sloped configuration, extending toward a respective one of the peripheral edge segments defined by the die paddle 114.

As indicated above, each of the third leads 122 is formed to include the downset 138, with each of the tie bars 116 likewise being formed to include the downset 140. As a result, the die paddle 114 of the leadframe 102 resides on a plane which is disposed below the plane of the dambar 110 and hence the fourth leads 124 integrally connected thereto. More particularly, the die paddle 114, the first leads 118, the tie ring 112, the second leads 120, and the pad portions 134 of the third leads 122 reside on a first plane, with the dambar 110, fourth leads 124, and those portions of the third leads 122 extending between the downsets 138 and dambar 110 residing on a second plane, such first and second planes being disposed in spaced, generally parallel relation to each other. It is contemplated that the top pad surfaces of the pad portions 126, 130, 134 and the top paddle surface of the die paddle 114 may extend in generally co-planar relation to each other, and that the bottom pad surfaces of the pad portions 126, 130, 134 and the bottom paddle surface of the die paddle 114 may likewise extend in generally co-planar relation to each other.

The leadframe 102 as shown in FIG. 6 is preferably fabricated from a conventional metal material, such as copper, copper alloy, steel plated with copper, or a functional equivalent. However, those of ordinary skill in the art will recognize that the present invention is not limited to any particular material for the leadframe 102. Additionally, the number of first, second, third and fourth leads 118, 120, 122, 124 shown in FIG. 6 is for illustrative purposes only, and may be modified according to application field. Along these lines, the first, second, third and fourth leads 118, 120, 122, 124 may have designs or configurations varying from those shown in FIG. 6 without departing from the spirit and scope of the present invention. For example, rather than each pad portion 130, 132, 134 having a generally rectangular configuration as shown in FIG. 6, each such pad portion 130, 132, 134 may be formed to have a generally square configuration. Additionally, though the first, second, third and fourth leads 118, 120, 122, 124 are shown as each being segregated into four sets, it will be recognized that fewer sets of the first, second, third and fourth leads 118, 120, 122, 124 may be provided, and may be arranged along any combination of two or three of the peripheral sides of the die paddle 114. Moreover, less than four tie bars 116 may be included in the leadframe 102, extending to respective corners of the die paddle 114 in any combination. Due to the connection of each of the first, second and third leads 118, 120, 122 to the tie ring 112 which is itself connected to the tie bars 116, it is contemplated that none of those first leads 118 defining signal pins need be connected to the die paddle 114, all of the first leads 118 thus being identically configured. Along these lines, none of the second leads 120 need necessarily include the tie bar portion 132 integrally connecting the same to the die paddle 114. It is further contemplated that the leadframe 102 may be fabricated through the implementation of a chemical etching process or alternatively a mechanical stamping process.

In the semiconductor package 100, the semiconductor die 104 is attached to the top paddle surface of the die paddle 114, such attachment preferably being facilitated through the use of a suitable die attach material, such as an adhesive. Included on the top surface of the semiconductor die 104 is a plurality of bond pads or terminals 105. In the semiconductor package 100, these terminals 105 of the semiconductor die 104 are electrically connected to respective ones of the first, second, third and fourth leads 118, 120, 122, 124 through the use of the conductive wires 106. In FIG. 6, only a few exemplary wires 106 are depicted, those of ordinary skill in the art recognizing that the semiconductor package 100 will typically include wires 106 in a suitable number which effectively electrically connects the semiconductor die 104 to virtually all of the first, second, third and fourth leads 118, 120, 122, 124 included in the leadframe 102. It is contemplated that for each of the first, second and third leads 118, 120, 122, the corresponding wires 106 will be extended to the top pad surfaces of the pad portions 126, 130, 134, 136 thereof. For each fourth lead 124, it is contemplated that the corresponding wire 106 may be extended to any portion of the top lead surface thereof which is ultimately covered by the package body 108 in the manner described below. The conductive wires 106 may be fabricated from aluminum, copper, gold, silver, or a functional equivalent. However, those of ordinary skill in the art will recognize that the present invention is not limited to any particular material for the wires 106.

Referring now to FIG. 7, in the semiconductor package 100, the die paddle 114, the first, second, third and fourth leads 118, 120, 122, 124, the semiconductor die 104 and the conductive wires 106 are encapsulated or covered by an encapsulant material which, upon hardening, forms the package body 108 of the semiconductor package 100. In the completed semiconductor package 100, the generally planar bottom pad surfaces of the pad portions 126, 130, 134 of the first, second and third leads 118, 120, 122 are exposed in and substantially flush with a generally planar bottom surface defined by the fully formed package body 108. Also exposed in and substantially flush with the bottom surface of the package body 108 are the generally planar bottom paddle surface of the die paddle 114 and the generally planar bottom ring surface of the tie ring 112. Distal portions of the fourth leads 124 protrude from respective ones of multiple side surfaces defined by the package body 108. These exposed portions of the fourth leads 124 are preferably bent so as to impart a generally gull-wing configuration thereto in the manner shown in FIG. 7. Other than for the bottom pad surfaces of the pad portions 126, 130, 134 of the first, second and third leads 118, 120, 122 and those portions of the fourth leads 124 protruding from the side surfaces of the package body 108, it is contemplated that the remainder of each of the first, second, third and fourth leads 118, 120, 122, 124 will be covered by the package body 108.

The semiconductor package 100 as shown in FIG. 6 is not depicted in a fully fabricated state since the dambar 110 and tie ring 112 have not yet been removed from the leadframe 102 to effectively facilitate the electrical isolation of the first, second, third and fourth leads 118, 120, 122, 124 from each other. In this regard, subsequent to the formation of the package body 108 in the above-described manner, it is contemplated that the package body 108 will be subjected to a partial saw process. In this partial sawing process, a saw blade is penetrated into the bottom surface of the package body 108 to a depth and along axes which facilitate the severing or removal of the tie ring 112, thus electrically isolating the first and second leads 118, 120 from each other and from the third and fourth leads 122, 124. However, it will be recognized that the removal of the tie ring 112 does not electrically isolate any first leads 118 which define signal pins and remain integrally connected to the die paddle 114, or any second leads 120 which remain integrally connected to the die paddle 114 by the corresponding tie bar portions 132. The artifact which remains in the bottom surface of the package body 108 as a result of such partial sawing or singulation step are four elongate, generally straight grooves 144 which are arranged in a generally quadrangular pattern. Prior to the bending of the exposed portions of the fourth leads 124 as described above and subsequent to the formation of the package body 108, it is contemplated that a conventionally known debarring process will be implemented to remove the dambar 110 as needed to electrically isolate the third and fourth leads 122, 124 from each other. Advantageously, in the semiconductor package 100, the connection of the first, second and third leads 118, 120, 122 to the common tie ring 112 and the connection of the third and fourth leads 122, 124 to the common dambar 110 maintains tight positional consistency in relation to the relative orientations of the first, second, third and fourth leads 118, 120, 122, 124. Further, the encapsulation of the downsets 138 of the third leads 122 by the package body 108 facilitates the anchoring or locking of the third leads 122 to the package body 108, thus eliminating the need to form any locking features therein via a half-etching or coining technique.

Figure 9:
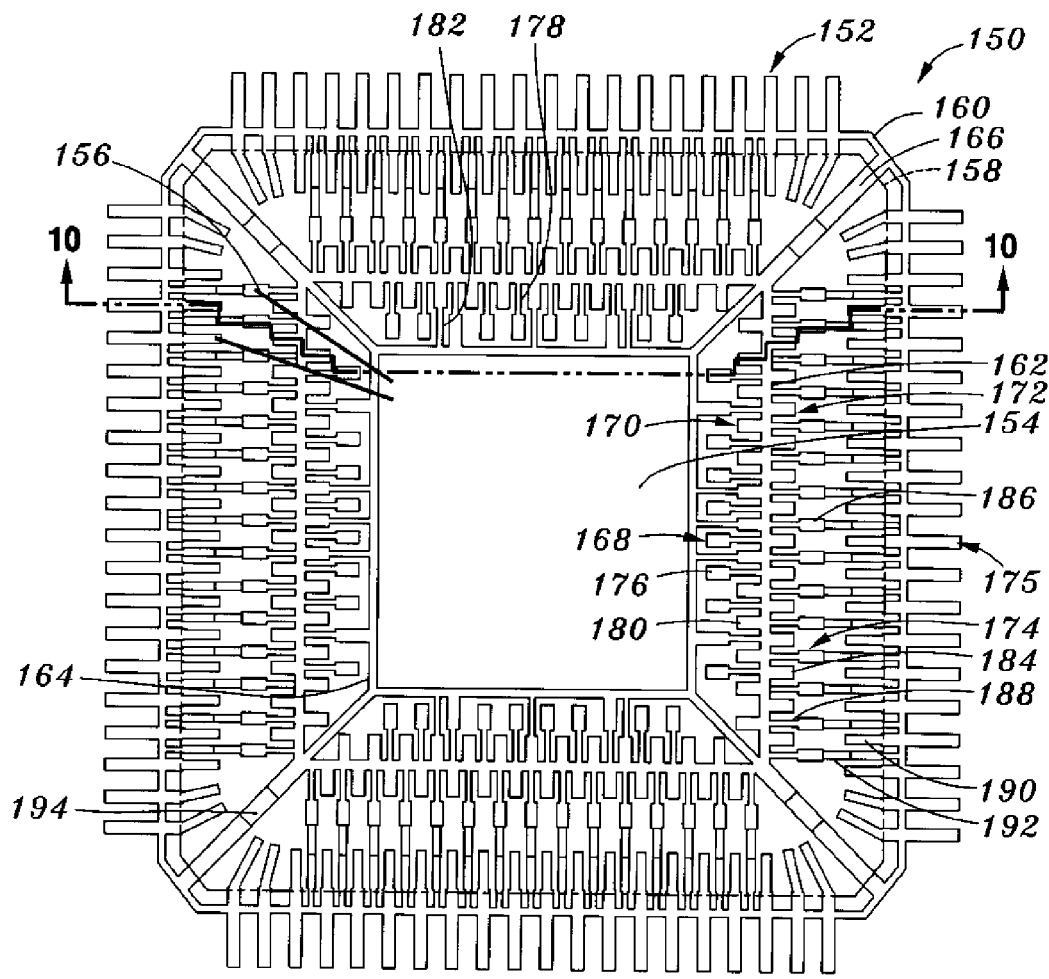
FIG. 9 is a top plan view of a semiconductor package constructed in accordance with a fourth embodiment of the present invention, the package body being shown in phantom to facilitate the depiction of the leadframe and semiconductor die thereof.
Figure 10:
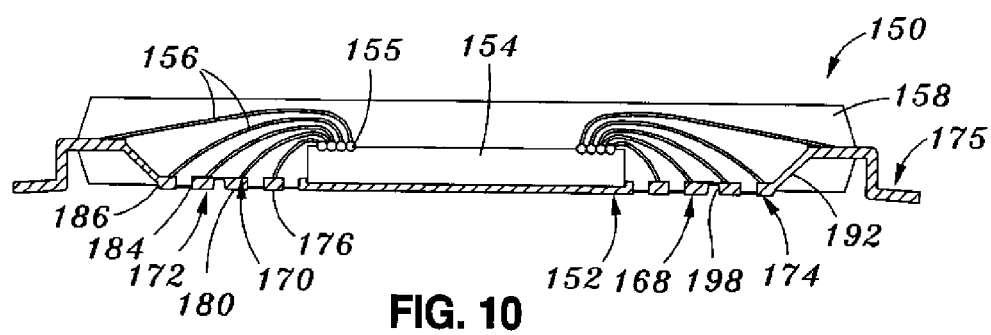
FIG. 10 is a cross-sectional view of the semiconductor package of the fifth embodiment of the present invention taken along line 10-10 of FIG. 9.

Referring now to FIGS. 9 and 10, there is depicted a semiconductor package 150 constructed in accordance with a fourth embodiment of the present invention. The major structural elements of the semiconductor package 150 include a leadframe 152, a semiconductor die 154 attached to the leadframe 152 and electrically connected thereto by conductive wires 156, and a package body 158 which fully encapsulates the semiconductor die 154 and wires 156, and partially encapsulates the leadframe 152 in a manner which will be described in more detail below. In FIG. 9, the outline of the package body 158 of the semiconductor package 150 is shown in phantom so as to provide an unobstructed view of the leadframe 152 and semiconductor package 154 attached thereto through the use of the wires 156.

The leadframe 152 of the semiconductor package 150 includes a peripheral outer dambar 160. Located within the outer dambar 160 is a continuous, generally quadrangular tie ring 162. Disposed within the tie ring 162 is a generally quadrangular die paddle 164 of the leadframe 152. The die paddle 164 defines opposed, generally planar top and bottom paddle surfaces, and is connected to the both the tie ring 162 and the dambar 160 by a plurality of tie bars 166 which extend diagonally from respective ones of the four corners defined by the die paddle 164.

In addition to the die paddle 164, the leadframe 152 of the semiconductor package 150 comprises a plurality of first leads 168 which are each integrally connected to the tie ring 162 and extend inwardly toward the die paddle 164. The leadframe 152 also includes a plurality of second leads 170 which are each integrally connected to the tie ring 162 and extend inwardly toward the die paddle 164, and a plurality of third leads 172 which are also each integrally connected to the tie ring 162 and extend outwardly toward the dambar 160. Certain ones of the second leads 170 of each set are also integrally connected to the die paddle 164. Also included in the leadframe 152 is a plurality of fourth leads 174 which are each integrally connected to and extend between the tie ring 162 and the dambar 160, and a plurality of fifth leads 175 which are each integrally connected to the dambar 160. As seen in FIG. 9, the first, second, third and fourth leads 168, 170, 172, 174 are each segregated into four sets, with the first, second, third and fourth leads 168, 170, 172, 174 of each set extending along a respective one of the four peripheral edge segments defined by the die paddle 164. In the leadframe 152, certain ones of the first leads 168 of each set are of increased length and are also each integrally connected to the die paddle 164 in addition to the tie ring 162, such first leads 168 defining signal pins which extend between the tie ring 162 and the die paddle 164. The fourth leads 175 are also segregated into four sets, with the fourth leads 175 of each set extending along a respective one of the four peripheral edge segments defined by the die paddle 164 in spaced relation thereto. Thus, the first, second, third, fourth and fifth leads 168, 170, 172, 174, 175 are generally arranged as five concentric rings, the first leads 168 defining an inner ring which is circumvented or circumscribed by a middle inner ring defined by the second leads 170, such middle inner ring itself being circumvented by a middle ring defined by the third leads 172. This middle ring is circumvented by a middle outer ring defined by the fourth leads 174, with such middle outer ring being circumvented by an outer ring defined by the fifth leads 175. As further seen in FIG. 9, the first and second leads 168, 170 are arranged in a staggered or offset relationship such that a portion of each first lead 168 of each set thereof extends between and in spaced relation to a respective pair of the second leads 170 of the corresponding set thereof. Similarly, the third and fourth leads 172, 174 are arranged in a staggered or offset relationship such that each third lead 172 of each set thereof extends between and in spaced relation to a respective pair of the fourth leads 174 of the corresponding set thereof. The fourth and fifth leads 174, 175 are also arranged in a staggered or offset relationship such that a portion of each fourth lead 172 of each set thereof extends between and in spaced relation to a respective pair of the fifth leads 175 of the corresponding set thereof. Each set of second leads 170 is also staggered or offset relative to the corresponding set of third leads 172.

In the semiconductor package 150, each of the first leads 168 includes an enlarged pad portion 176 which defines opposed, generally planar top and bottom pad surfaces. In each first lead 168, protruding from the outer end of the pad portion 176 (which is furthest from the die paddle 114) is a tie bar portion 178 which is used to operatively connect the pad portion 176 to the tie ring 162. Each of the second leads 170 also includes an enlarged pad portion 180 which defines opposed, generally planar top and bottom pad surfaces. In each second lead 170, the outer end of the pad portion 180 (which is furthest from the die paddle 164) is integrally connected to the tie ring 162. Protruding from the opposite, inner end of the pad portion 180 of some of the second leads 170 is a tie bar portion 182 which is used to operatively connect the corresponding pad portion 180 to the die paddle 164. Each of the third leads 172 includes an enlarged pad portion 184 which defines opposed, generally planar top and bottom pad surfaces. In each third lead 172, the inner end of the pad portion 184 (which is closest to the die paddle 164) is integrally connected to the tie ring 162. Each of the fourth leads 174 includes an enlarged pad portion 186 which defines opposed, generally planar top and bottom pad surfaces. In each fourth lead 174, protruding from the inner end of the pad portion 186 (which is closest to the die paddle 164) is an inner tie bar portion 188 which is used to operatively connect the pad portion 186 to an adjacent segment of the tie ring 162. Protruding from the opposite, outer end of the pad portion 186 is an outer tie bar portion 190 which is used to operatively connect the pad portion 186 to the dambar 160. It is contemplated that the outer tie bar portion 190 of each fourth lead 174 will be formed to include a downset 192 therein such that the pad portion 186 and that segment of the corresponding tie bar portion 190 extending between the downset 192 and the dambar 160 will extend along respective ones of a spaced, substantially parallel pair of planes. Similarly, it is contemplated that each tie bar 166 will be formed to include a downset 194 such that the segment of each tie bar 166 between the downset 194 and the die paddle 164 and that segment of the same tie bar 166 between the downset 194 and the dambar 160 will likewise extend along respective ones of a spaced, generally parallel pair of planes.

Each of the fifth leads 175 of the leadframe 152 is integrally connected to only the dambar 160 of the leadframe 152 as indicated above, and as shown in FIG. 9. Each fifth lead 175 defines an inner end portion 196 having a width which is slightly less than the width of the remainder thereof. In this regard, the inner end portions 196 of the majority of the fifth leads 175 of each set are disposed between the inner tie bar portions 188 of a corresponding pair of the fourth leads 172 in the manner also shown in FIG. 9, the inner end portion 196 terminating at approximately the outer and/or the inner, distal ends of the downsets 192 of the corresponding pair of fourth leads 172. The reduced width of the inner end portions 196 of the fifth leads 175, coupled with the reduced width of the inner tie bar portion 188 relative to the pad portion 186 in each fourth lead 172, effectively creates a sufficient pitch or clearance between each of the interleaved sets of the fourth and fifth leads 174, 175. As further seen in FIG. 9, the inner end portions 196 of those fifth leads 175 disposed proximate the tie bars 166 each preferably have an angled or sloped configuration, extending toward a respective one of the peripheral edge segments defined by the die paddle 164.

As indicated above, each of the fourth leads 172 is formed to include the downset 192, with each of the tie bars 166 likewise being formed to include the downset 194. As a result, the die paddle 164 of the leadframe 152 resides on a plane which is disposed below the plane of the dambar 160 and hence the fifth leads 175 integrally connected thereto. More particularly, the die paddle 164, the first leads 168, the second leads 170, the tie ring 162, the third leads 172, and the pad portions 184 of the fourth leads 174 reside on a first plane, with the dambar 160, fifth leads 175, and those portions of the fourth leads 174 extending between the downsets 192 and dambar 160 residing on a second plane, such first and second planes being disposed in spaced, generally parallel relation to each other. It is contemplated that the top pad surfaces of the pad portions 176, 180, 184, 186 and the top paddle surface of the die paddle 164 may extend in generally co-planar relation to each other, and that the bottom pad surfaces of the pad portions 176, 180, 184, 188 and the bottom paddle surface of the die paddle 164 may likewise extend in generally co-planar relation to each other.

The leadframe 152 as shown in FIG. 9 is preferably fabricated from a conventional metal material, such as copper, copper alloy, steel plated with copper, or a functional equivalent. However, those of ordinary skill in the art will recognize that the present invention is not limited to any particular material for the leadframe 152. Additionally, the number of first, second, third, fourth and fifth leads 168, 170, 172, 174, 175 shown in FIG. 9 is for illustrative purposes only, and may be modified according to application field. Along these lines, the first, second, third, fourth and fifth leads 168, 170, 172, 174, 175 may have designs or configurations varying from those shown in FIG. 9 without departing from the spirit and scope of the present invention. For example, rather than each pad portion 176, 180, 184, 186 having a generally rectangular configuration as shown in FIG. 9, each such pad portion 176, 180, 184, 186 may be formed to have a generally square configuration. Additionally, though the first, second, third, fourth and fifth leads 168, 170, 172, 174, 175 are shown as each being segregated into four sets, it will be recognized that fewer sets of the first, second, third, fourth and fifth leads 168, 170, 172, 174, 175 may be provided, and may be arranged along any combination of two or three of the peripheral sides of the die paddle 164. Moreover, less than four tie bars 166 may be included in the leadframe 152, extending to respective corners of the die paddle 164 in any combination. Due to the connection of each of the first, second, third and fourth leads 168, 170, 172, 174 to the tie ring 162 which is itself connected to the tie bars 166, it is contemplated that none of those first leads 168 defining signal pins need be connected to the die paddle 164, all of the first leads 168 thus being identically configured. Along these lines, none of the second leads 170 need necessarily include the tie bar portion 182 integrally connecting the same to the die paddle 164. It is further contemplated that the leadframe 152 may be fabricated through the implementation of a chemical etching process or alternatively a mechanical stamping process.

In the semiconductor package 150, the semiconductor die 154 is attached to the top paddle surface of the die paddle 164, such attachment preferably being facilitated through the use of a suitable die attach material, such as an adhesive. Included on the top surface of the semiconductor die 154 is a plurality of bond pads or terminals 155. In the semiconductor package 150, these terminals 155 of the semiconductor die 154 are electrically connected to respective ones of the first, second, third, fourth and fifth leads 168, 170, 172, 174, 175 through the use of the conductive wires 156. In FIG. 9, only a few exemplary wires 156 are depicted, those of ordinary skill in the art recognizing that the semiconductor package 150 will typically include wires 156 in a suitable number which effectively electrically connects the semiconductor die 154 to virtually all of the first, second, third, fourth and fifth leads 168, 170, 172, 174, 175 included in the leadframe 152. It is contemplated that for each of the first, second, third and fourth leads 168, 170, 172, 174, the corresponding wires 156 will be extended to the top pad surfaces of the pad portions 176, 180, 184, 186 thereof. For each fifth lead 175, it is contemplated that the corresponding wire 156 may be extended to any portion of the top lead surface thereof which is ultimately covered by the package body 158 in the manner described below. The conductive wires 156 may be fabricated from aluminum, copper, gold, silver, or a functional equivalent. However, those of ordinary skill in the art will recognize that the present invention is not limited to any particular material for the wires 156.

Referring now to FIG. 10, in the semiconductor package 150, the die paddle 164, the first, second, third, fourth and fifth leads 168, 170, 172, 174, 175, the semiconductor die 154 and the conductive wires 156 are encapsulated or covered by an encapsulant material which, upon hardening, forms the package body 158 of the semiconductor package 150. In the completed semiconductor package 150, the generally planar bottom pad surfaces of the pad portions 176, 180, 184, 186 of the first, second, third and fourth leads 168, 170, 172, 174 are exposed in and substantially flush with a generally planar bottom surface defined by the fully formed package body 158. Also exposed in and substantially flush with the bottom surface of the package body 158 are the generally planar bottom paddle surface of the die paddle 164 and the generally planar bottom ring surface of the tie ring 162. Distal portions of the fifth leads 175 protrude from respective ones of multiple side surfaces defined by the package body 158. These exposed portions of the fifth leads 175 are preferably bent so as to impart a generally gull-wing configuration thereto in the manner shown in FIG. 10. Other than for the bottom pad surfaces of the pad portions 176, 180, 184, 186 of the first, second, third and fourth leads 168, 170, 172, 174 and those portions of the fifth leads 175 protruding from the side surfaces of the package body 158, it is contemplated that the remainder of each of the first, second, third, fourth and fifth leads 168, 170, 172, 174, 175 will be covered by the package body 158.

The semiconductor package 150 as shown in FIG. 9 is not depicted in a fully fabricated state since the dambar 160 and tie ring 162 have not yet been removed from the leadframe 152 to effectively facilitate the electrical isolation of the first, second, third and fifth leads 168, 170, 172, 174, 175 from each other. In this regard, subsequent to the formation of the package body 158 in the above-described manner, it is contemplated that the package body 158 will be subjected to a partial saw process. In this partial sawing process, a saw blade is penetrated into the bottom surface of the package body 158 to a depth and along axes which facilitate the severing or removal of the tie ring 162, thus electrically isolating the first, second and third leads 168, 170, 172 from each other and from the fourth and fifth leads 174, 175. However, it will be recognized that the removal of the tie ring 162 does not electrically isolate any first leads 168 which define signal pins and remain integrally connected to the die paddle 164, or any second leads 170 which remain integrally connected to the die paddle 164 by the corresponding tie bar portions 182. The artifact which remains in the bottom surface of the package body 158 as a result of such partial sawing or singulation step are four elongate, generally straight grooves 198 which are arranged in a generally quadrangular pattern. Prior to the bending of the exposed portions of the fifth leads 175 as described above and subsequent to the formation of the package body 158, it is contemplated that a conventionally known debarring process will be implemented to remove the dambar 160 as needed to electrically isolate the fourth and fifth leads 174, 175 from each other. Advantageously, in the semiconductor package 150, the connection of the first, second, third and fourth leads 168, 170, 172, 174 to the common tie ring 162 and the connection of the fourth and fifth leads 174, 175 to the common dambar 160 maintains tight positional consistency in relation to the relative orientations of first, second, third, fourth and fifth leads 168, 170, 172, 174, 175. Further, the encapsulation of the downsets 192 of the fourth leads 174 by the package body 158 facilitates the anchoring or locking of the fourth leads 174 to the package body 158, thus eliminating the need to form any locking features therein via a half-etching or coining technique.

Figure 11:
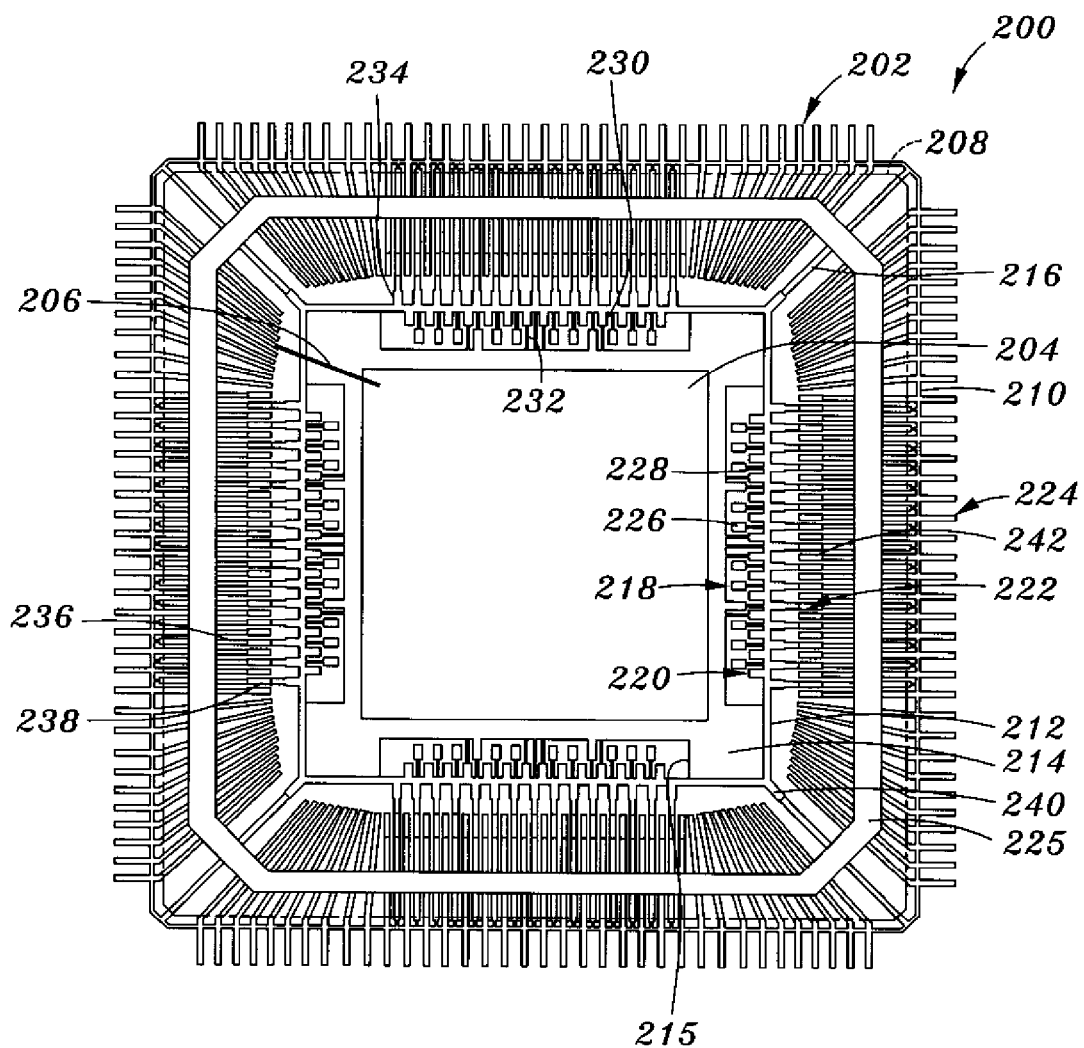
FIG. 11 is a top plan view of a semiconductor package constructed in accordance with a fifth embodiment of the present invention, the package body being shown in phantom to facilitate the depiction of the leadframe thereof.

Referring now to FIG. 11, there is depicted a semiconductor package 200 constructed in accordance with a fifth embodiment of the present invention. The major structural elements of the semiconductor package 200 include a leadframe 202, a semiconductor die 204 attached to the leadframe 202 and electrically connected thereto by conductive wires 206, and a package body 208 which fully encapsulates the semiconductor die 204 and wires 206, and partially encapsulates the leadframe 202 in a manner which will be described in more detail below. In FIG. 11, the outline of the package body 208 of the semiconductor package 200 is shown in phantom so as to provide an unobstructed view of the leadframe 202 and semiconductor package 204 attached thereto through the use of the wires 206.

The leadframe 202 of the semiconductor package 200 includes a peripheral outer dambar 210. Located within the outer dambar 210 is a continuous, generally quadrangular tie ring 212. Disposed within the tie ring 212 is a generally quadrangular die paddle 214 of the leadframe 202. The die paddle 214 defines opposed, generally planar top and bottom paddle surfaces, and is connected to the both the tie ring 212 and the dambar 210 by a plurality of tie bars 216 which extend diagonally from respective ones of the four corners defined by the die paddle 214. The die paddle 214 further defines four peripheral edge segments, each of which is formed to include a generally quadrangular notch or recess 215 therein. The use of these recesses 215 will be discussed below.

In addition to the die paddle 214, the leadframe 202 of the semiconductor package 200 comprises a plurality of first leads 218 which are each integrally connected to the tie ring 212 and extend inwardly toward the die paddle 214. The leadframe 202 also includes a plurality of second leads 220 which are also each integrally connected to the tie ring 212 and extend inwardly toward the die paddle 214, and a plurality of third leads 222 which are each integrally connected to and extend between the tie ring 212 and the dambar 210. Certain ones of the second leads 220 of each set are also integrally connected to the die paddle 214. In addition to the first, second and third leads 218, 220, 222, the leadframe 202 includes a plurality of fourth leads 224 which are each integrally connected to the dambar 210. As seen in FIG. 11, the first, second and third leads 218, 220, 222 are each segregated into four sets, with the first, second and third leads 218, 220, 222 of each set extending along a respective one of the four sides defined by the die paddle 114. Further, the first and second leads 218, 220 of each set are arranged so as to be positioned within respective ones of the recesses 215 in the manner shown in FIG. 11. In the leadframe 202, certain ones of the first leads 218 of each set are of increased length and are also each integrally connected to the die paddle 214 in addition to the tie ring 212, such first leads 218 defining signal pins which extend between the tie ring 212 and the die paddle 214. The fourth leads 224 are also segregated into four sets, with the fourth leads 224 of each set extending along a respective one of the four sides defined by the die paddle 214 in spaced relation thereto. Thus, the first, second, third and fourth leads 218, 220, 222, 224 are generally arranged as four concentric rings, the first leads 218 defining an inner ring which is circumvented or circumscribed by a middle inner ring defined by the second leads 220, such middle inner ring itself being circumvented by a middle outer ring defined by the third leads 222. This middle outer ring is circumvented by an outer ring defined by the fourth leads 224. As further seen in FIG. 11, the first and second leads 218, 220 are arranged in a staggered or offset relationship such that a portion of each first lead 218 of each set thereof extends between and in spaced relation to a respective pair of the second leads 220 of the corresponding set thereof. Similarly, the third and fourth leads 222, 224 are arranged in a staggered or offset relationship such that a portion of each third lead 222 of each set thereof extends between and in spaced relation to a respective pair of the fourth leads 224 of the corresponding set thereof. Each set of second leads 220 is also staggered or offset relative to the corresponding set of third leads 222. A tape strip 225 is extended along portions of the third and fourth leads 222, 224 of each set to provide structural support thereto.

In the semiconductor package 200, each of the first leads 218 includes an enlarged pad portion 226 which defines opposed, generally planar top and bottom pad surfaces. In each first lead 218, protruding from the outer end of the pad portion 226 (which is furthest from the die paddle 214) is a tie bar portion 228 which is used to operatively connect the pad portion 226 to the tie ring 212. Each of the second leads 220 also includes an enlarged pad portion 230 which defines opposed, generally planar top and bottom pad surfaces. In each second lead 220, the outer end of the pad portion 230 (which is furthest from the die paddle 214) is integrally connected to the tie ring 212. Protruding from the opposite, inner end of the pad portion 230 of some of the second leads 220 is a tie bar portion 232 which is used to operatively connect the corresponding pad portion 230 to the die paddle 214. Each of the third leads 222 includes an enlarged pad portion 234 which defines opposed, generally planar top and bottom pad surfaces. In each third lead 222, the inner end of the pad portion 234 (which is closest to the die paddle 214) is integrally connected to the tie ring 212. Protruding from the opposite, outer end of the pad portion 234 of each third lead 222 is a tie bar portion 236 which is used to operatively connect the pad portion 234 to the dambar 210. It is contemplated that the tie bar portion 236 of each third lead 222 will be formed to include a downset 238 therein such that the pad portion 234 and that segment of the corresponding tie bar portion 236 extending between the downset 238 and the dambar 210 will extend along respective ones of a spaced, substantially parallel pair of planes. Similarly, it is contemplated that each tie bar 216 will be formed to include a downset 240 such that the segment of each tie bar 216 between the downset 240 and the die paddle 214 and that segment of the same tie bar 216 between the downset 240 and the dambar 210 will likewise extend along respective ones of a spaced, generally parallel pair of planes.

Each of the fourth leads 224 of the leadframe 202 is integrally connected to only the dambar 210 of the leadframe 202 as indicated above, and as shown in FIG. 11. Each fourth lead 224 defines an inner end portion 242 having a width which is slightly greater than the width of the remainder thereof. In this regard, the inner end portions 242 of the majority of the fourth leads 224 of each set are disposed between the tie bar portions 236 of a corresponding pair of the third leads 222 in the manner also shown in FIG. 11, the inner end portion 242 terminating at approximately the outer and/or the inner, distal ends of the downsets 238 of the corresponding pair of third leads 222. As further seen in FIG. 11, the inner end portions 242 of those fourth leads 224 disposed proximate the tie bars 216 each preferably have an angled or sloped configuration, extending toward a respective one of the sides of the die paddle 214.

As indicated above, each of the third leads 222 is formed to include the downset 238, with each of the tie bars 216 likewise being formed to include the downset 240. As a result, the die paddle 214 of the leadframe 202 resides on a plane which is disposed below the plane of the dambar 210 and hence the fourth leads 224 integrally connected thereto. More particularly, the die paddle 214, the first leads 218, the tie ring 212, the second leads 220, and the pad portions 234 of the third leads 222 reside on a first plane, with the dambar 210, fourth leads 224, and those portions of the third leads 222 extending between the downsets 238 and dambar 210 residing on a second plane, such first and second planes being disposed in spaced, generally parallel relation to each other. It is contemplated that the top pad surfaces of the pad portions 226, 230, 234 and the top paddle surface of the die paddle 214 may extend in generally co-planar relation to each other, and that the bottom pad surfaces of the pad portions 226, 230, 234 and the bottom paddle surface of the die paddle 214 may likewise extend in generally co-planar relation to each other.

The leadframe 202 as shown in FIG. 11 is preferably fabricated from a conventional metal material, such as copper, copper alloy, steel plated with copper, or a functional equivalent. However, those of ordinary skill in the art will recognize that the present invention is not limited to any particular material for the leadframe 202. Additionally, the number of first, second, third and fourth leads 218, 220, 222, 224 shown in FIG. 11 is for illustrative purposes only, and may be modified according to application field. Along these lines, the first, second, third and fourth leads 218, 220, 222, 224 may have designs or configurations varying from those shown in FIG. 11 without departing from the spirit and scope of the present invention. For example, rather than each pad portion 230, 232, 234 having a generally rectangular configuration as shown in FIG. 11, each such pad portion 230, 232, 234 may be formed to have a generally square configuration. Additionally, though the first, second, third and fourth leads 218, 220, 222, 224 are shown as each being segregated into four sets, it will be recognized that fewer sets of the first, second, third and fourth leads 218, 220, 222, 224 may be provided, and may be arranged along any combination of two or three of the peripheral sides of the die paddle 214. Moreover, less than four tie bars 216 may be included in the leadframe 202, extending to respective corners of the die paddle 214 in any combination. Due to the connection of each of the first, second and third leads 218, 220, 222 to the tie ring 212 which is itself connected to the tie bars 216, it is contemplated that none of those first leads 218 defining signal pins need be connected to the die paddle 214, all of the first leads 218 thus being identically configured. Along these lines, none of the second leads 220 need necessarily include the tie bar portion 232 integrally connecting the same to the die paddle 214. It is further contemplated that the leadframe 202 may be fabricated through the implementation of a chemical etching process or alternatively a mechanical stamping process.

In the semiconductor package 200, the semiconductor die 204 is attached to the top paddle surface of the die paddle 214, such attachment preferably being facilitated through the use of a suitable die attach material, such as an adhesive. Included on the top surface of the semiconductor die 204 is a plurality of bond pads or terminals. In the semiconductor package 200, these terminals of the semiconductor die 204 are electrically connected to respective ones of the first, second, third and fourth leads 218, 220, 222, 224 through the use of the conductive wires 206. In FIG. 11, only a few exemplary wires 206 are depicted, those of ordinary skill in the art recognizing that the semiconductor package 200 will typically include wires 206 in a suitable number which effectively electrically connects the semiconductor die 204 to virtually all of the first, second, third and fourth leads 218, 220, 222, 224 included in the leadframe 202. It is contemplated that for each of the first, second and third leads 218, 220, 222, the corresponding wires 206 will be extended to the top pad surfaces of the pad portions 226, 230, 234 thereof. For each fourth lead 224, it is contemplated that the corresponding wire 206 may be extended to any portion of the top lead surface thereof which is ultimately covered by the package body 208 in the manner described below. The conductive wires 206 may be fabricated from aluminum, copper, gold, silver, or a functional equivalent. However, those of ordinary skill in the art will recognize that the present invention is not limited to any particular material for the wires 206.

In the semiconductor package 200, the die paddle 214, the first, second, third and fourth leads 218, 220, 222, 224, the semiconductor die 204 and the conductive wires 206 are encapsulated or covered by an encapsulant material which, upon hardening, forms the package body 208 of the semiconductor package 200. In the completed semiconductor package 200, the generally planar bottom pad surfaces of the pad portions 226, 230, 234 of the first, second and third leads 218, 220, 222 are exposed in and substantially flush with a generally planar bottom surface defined by the fully formed package body 208. Also exposed in and substantially flush with the bottom surface of the package body 208 are the generally planar bottom paddle surface of the die paddle 214 and the generally planar bottom ring surface of the tie ring 212. Distal portions of the fourth leads 224 protrude from respective ones of multiple side surfaces defined by the package body 208. These exposed portions of the fourth leads 224 are preferably bent so as to impart a generally gull-wing configuration thereto in the manner shown in relation to those embodiments of the semiconductor packages described above. Other than for the bottom pad surfaces of the pad portions 226, 230, 234 of the first, second and third leads 218, 220, 222 and those portions of the fourth leads 224 protruding from the side surfaces of the package body 208, it is contemplated that the remainder of each of the first, second, third and fourth leads 218, 220, 222, 224 will be covered by the package body 208.

The semiconductor package 200 as shown in FIG. 11 is not depicted in a fully fabricated state since the dambar 210 and tie ring 212 have not yet been removed from the leadframe 202 to effectively facilitate the electrical isolation of the first, second, third and fourth leads 218, 220, 222, 224 from each other. In this regard, subsequent to the formation of the package body 208 in the above-described manner, it is contemplated that the package body 208 will be subjected to a partial saw process. In this partial sawing process, a saw blade is penetrated into the bottom surface of the package body 208 to a depth and along axes which facilitate the severing or removal of the tie ring 212, thus electrically isolating the first and second leads 218, 220 from each other and from the third and fourth leads 222, 224. However, it will be recognized that the removal of the tie ring 212 does not electrically isolate any first leads 218 which define signal pins and remain integrally connected to the die paddle 214, or any second leads 220 which remain integrally connected to the die paddle 214 by the corresponding tie bar portions 232. The artifact which remains in the bottom surface of the package body 208 as a result of such partial sawing or singulation step are four elongate, generally straight grooves which are arranged in a generally quadrangular pattern. Prior to the bending of the exposed portions of the fourth leads 224 as described above and subsequent to the formation of the package body 208, it is contemplated that a conventionally known debarring process will be implemented to remove the dambar 210 as needed to electrically isolate the third and fourth leads 222, 224 from each other. Advantageously, in the semiconductor package 200, the connection of the first, second and third leads 218, 220, 222 to the common tie ring 212 and the connection of the third and fourth leads 222, 224 to the common dambar 210 maintains tight positional consistency in relation to the relative orientations of the first, second, third and fourth leads 218, 220, 222, 224. Further, the encapsulation of the downsets 238 of the third leads 222 by the package body 208 facilitates the anchoring or locking of the third leads 222 to the package body 208, thus eliminating the need to form any locking features therein via a half-etching or coining technique.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a generally planar die paddle defining opposed top and bottom paddle surfaces and multiple peripheral edge segments;
   a plurality of first leads which each define opposed top and bottom first lead surfaces, the first leads being segregated into at least two sets which extend along respective ones of at least two peripheral edge segments of the die paddle;
   a plurality of second leads which each define opposed top and bottom second lead surfaces and include a downset formed therein, the second leads being segregated into at least two sets which extend along respective ones of at least two peripheral edge segments of the die paddle in electrical isolation from the die paddle and each other;
   a semiconductor die attached to the top paddle surface of the die paddle and electrically connected to at least one of each of the first and second leads; and
   a package body defining a generally planar bottom surface and multiple side surfaces, the package body at least partially encapsulating the first and second leads and the semiconductor die such that the downsets of the second leads are covered by the package body, and at least portions of the bottom paddle surface of the die paddle and the bottom first and second lead surfaces of the first and second leads are exposed in and substantially flush with the bottom surface of the package body, the bottom first lead surfaces of the first leads of each of the sets thereof being disposed between one of the peripheral edge segments of the die paddle and the bottom second lead surfaces of the second leads of a corresponding one of the sets thereof.

2. The semiconductor package of claim 1 wherein the semiconductor die is electrically connected to the first and second leads by conductive wires which are covered by the package body.

3. The semiconductor package of claim 1 wherein the die paddle has a generally quadrangular configuration, and the first and second leads are segregated into at least four sets which each extend along a respective one of the peripheral edge segments of the die paddle.

4. The semiconductor package of claim 3 wherein:
   each of the second leads includes a pad portion which is exposed in the bottom surface of the package body and a tie bar portion which protrudes from the pad portion and includes the downset formed therein.

5. The semiconductor package of claim 4 wherein:
   the die paddle, the first leads and the pad portions of the second leads extend along a first plane; and
   portions of the tie bar portions of the second leads each extend along a second plane which is disposed in spaced, generally parallel relation to the first plane.

6. A semiconductor package comprising:
- a generally planar die paddle defining opposed top and bottom paddle surfaces and multiple peripheral edge segments;
- a plurality of first leads which each define opposed top and bottom first lead surfaces, the first leads being segregated into at least two sets which extend along respective ones of at least two peripheral edge segments of the die paddle;
- a plurality of second leads which each define opposed top and bottom second lead surfaces, at least some of the second leads each including a downset formed therein, the second leads being segregated into at least two sets which extend along respective ones of at least two peripheral edge segments of the die paddle in electrical isolation from the die paddle and each other;
- a plurality of third leads segregated into at least two sets which extend along respective ones of at least two peripheral edge segments of the die paddle;
- a semiconductor die attached to the top paddle surface of the die paddle and electrically connected to at least one of each of the first, second and third leads; and
- a package body defining a generally planar bottom surface and multiple side surfaces, the package body at least partially encapsulating the first, second and third leads and the semiconductor die such that the downsets of the second leads are covered by the package body, at least portions of the bottom paddle surface of the die paddle and the bottom first and second lead surfaces of the first and second leads are exposed in and substantially flush with the bottom surface of the package body, and portions of the third leads protrude from respective ones of the side surfaces of the package body, the bottom first lead surfaces of the first leads of each of the sets thereof being disposed between one of the peripheral edge segments of the die paddle and the bottom second lead surfaces of the second leads of a corresponding one of the sets thereof.

7. The semiconductor package of claim 6 wherein at least some of the first leads are integrally connected to the die paddle and define signal pins.

8. The semiconductor package of claim 6 wherein at least some of the first leads are formed to include an enlarged locking tip structure to facilitate the anchoring thereof to the package body.

9. The semiconductor package of claim 6 wherein the die paddle has a generally quadrangular configuration, and the first, second and third leads are segregated into at least four sets which each extend along a respective one of the peripheral edge segments of the die paddle.

10. The semiconductor package of claim 9 wherein:
- each of the second leads includes a pad portion which is exposed in the bottom surface of the package body; and
- at least some of the second leads each include a tie bar portion which protrudes from the pad portion and has the downset formed therein; and
- each of the tie bar portions of the second leads extends between an adjacent pair of the third leads of a corresponding set thereof.

11. The semiconductor package of claim 10 wherein:
- the die paddle, the first leads, and the pads portions of the second leads extend along a first plane; and
- portions of the tie bar portions of the second leads and portions of the third leads each extend along a second plane which is disposed in spaced, generally parallel relation to the first plane.

12. A semiconductor package comprising:
- a die paddle defining opposed top and bottom paddle surfaces;
- a plurality of first leads which each define opposed top and bottom first lead surfaces, at least some of the first leads being disposed in spaced relation to the die paddle;
- a plurality of second leads which each define opposed top and bottom second lead surfaces, at least some of the second leads each including a downset formed therein, the second leads being disposed in spaced relation to the die paddle in electrical isolation from the die paddle and each other;
- a plurality of third leads disposed in spaced relation to the die paddle;
- a semiconductor die attached to the top paddle surface of the die paddle and electrically connected to at least one of each of the first, second and third leads; and
- a package body defining a bottom surface and a side surface, the package body at least partially encapsulating the first, second and third leads and the semiconductor die such that the downsets of the second leads are covered by the package body, at least portions of the bottom paddle surface of the die paddle and the bottom first and second lead surfaces of the first and second leads are exposed in the bottom surface of the package body, and portions of the third leads protrude from the side surface of the package body, the bottom first lead surfaces of the first leads being disposed closer to the die paddle than the bottom second lead surfaces of the second leads.

13. The semiconductor package of claim 12 wherein at least some of the first leads are integrally connected to the die paddle and define signal pins.

14. The semiconductor package of claim 12 wherein at least some of the first leads are formed to include an enlarged locking tip structure to facilitate the anchoring thereof to the package body.

15. The semiconductor package of claim 14 wherein at least some of the first leads are formed to include an opposed pair of ear portions to facilitate the anchoring thereof to the package body.

16. The semiconductor package of claim 12 wherein the die paddle has a generally quadrangular configuration, and the first, second and third leads are segregated into at least four sets which each extend along a respective one of the peripheral edge segments of the die paddle.

17. The semiconductor package of claim 16 wherein:
- each of the second leads includes a pad portion which is exposed in the bottom surface of the package body; and
- at least some of the second leads each include a tie bar portion which protrudes from the pad portion and has the downset formed therein; and
- each of the tie bar portions of the second leads extends between an adjacent pair of the third leads of a corresponding set thereof.

18. The semiconductor package of claim 17 wherein:
- the die paddle, the first leads, and the pads portions of the second leads extend along a first plane; and
- portions of the tie bar portions of the second leads and portions of the third leads each extend along a second plane which is disposed in spaced, generally parallel relation to the first plane.

19. The semiconductor package of claim 12 wherein the semiconductor die is electrically connected to the first, second and third leads by conductive wires which are covered by the package body.

20. The semiconductor package of claim 12 wherein at least some of the third leads are formed to include an inner end portion which is angled toward the die paddle.

* * * * *